US012323163B2

(12) United States Patent
Montorsi et al.

(10) Patent No.: US 12,323,163 B2
(45) **Date of Patent: *Jun. 3, 2025**

(54) LOW-DENSITY PARITY-CHECK (LDPC) ENCODING METHOD AND APPARATUS

(71) Applicant: HUAWEI TECHNOLOGIES CO., LTD., Guangdong (CN)

(72) Inventors: Guido Montorsi, Turin (IT); Sergio Benedetto, Turin (IT); Wei Lin, Shenzhen (CN); Yan Xin, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,768

(22) Filed: Jan. 4, 2024

(65) Prior Publication Data

US 2024/0204800 A1 Jun. 20, 2024

Related U.S. Application Data

(63) Continuation of application No. 17/732,776, filed on Apr. 29, 2022, now Pat. No. 11,901,914, which is a (Continued)

(30) Foreign Application Priority Data

Nov. 21, 2022 (CN) ........................ 201911047476.X

(51) Int. Cl.
*H03M 13/11* (2006.01)
*H03M 13/00* (2006.01)

(52) U.S. Cl.
CPC .... *H03M 13/1157* (2013.01); *H03M 13/1151* (2013.01); *H03M 13/616* (2013.01)

(58) Field of Classification Search
CPC ......... H03M 13/1157; H03M 13/1151; H03M 13/616
See application file for complete search history.

(56) References Cited

U.S. PATENT DOCUMENTS

2008/0028171 A1* 1/2008 Uratani ............... G06F 11/2071 714/E11.102
2009/0249157 A1 10/2009 Lee et al.
(Continued)

FOREIGN PATENT DOCUMENTS

CN 108988870 A 12/2018
CN 109491829 A 3/2019
(Continued)

OTHER PUBLICATIONS

Asterjadhi, "TGbe Nov. 2019 Meeting Agenda," IEEE 802.11-19/1722r11, Nov. 2019, 100 pages.
(Continued)

*Primary Examiner* — Samir W Rizk
(74) *Attorney, Agent, or Firm* — Fish & Richardson P.C.

(57) ABSTRACT

The present disclosure relates to low-density parity-check (LDPC) encoding methods and apparatus. One example method includes obtaining k information bits to be sent to a receive end, performing LDPC encoding on the k information bits by using a submatrix of ((n−k)/Z+j) rows and (n/Z+j) columns at an upper left corner of a check matrix H based on a first transmission code rate R satisfying R=k/(n+j×Z), obtaining a first codeword including the k information bits and (n−k+j×Z) redundant bits, and sending the first codeword to the receive end.

12 Claims, 9 Drawing Sheets

Related U.S. Application Data continuation of application No. PCT/CN2020/125484, filed on Oct. 30, 2020.

(56) References Cited

U.S. PATENT DOCUMENTS

| | | | | |
|---|---|---|---|---|
| 2018/0226992 | A1* | 8/2018 | Panteleev | H03M 13/616 |
| 2018/0278370 | A1 | 9/2018 | Jeong et al. | |
| 2018/0337691 | A1* | 11/2018 | Kalachev | H03M 13/616 |
| 2019/0158114 | A1 | 5/2019 | Zheng et al. | |
| 2019/0260390 | A1 | 8/2019 | Shutkin et al. | |
| 2019/0280718 | A1 | 9/2019 | Shinohara et al. | |
| 2020/0344007 | A1* | 10/2020 | Chen | H04L 1/1819 |

FOREIGN PATENT DOCUMENTS

| | | | | |
|---|---|---|---|---|
| CN | 109792254 | A | 5/2019 | |
| EP | 3497794 | A1 | 6/2019 | |
| WO | WO-2009004601 | A2 * | 1/2009 | H03M 13/033 |
| WO | 2017131813 | A1 | 8/2017 | |
| WO | 2018031777 | A1 | 2/2018 | |
| WO | 2018219001 | A1 | 12/2018 | |

OTHER PUBLICATIONS

Extended European Search Report in European AppIn No. 20880643.0, dated Oct. 11, 2022, 16 pages.

Huawei et al., “LDPC Design for eMBB Data,” 3GPP TSG RAN WG1 Meeting #88bis, R1-1704250, Spokane, USA, Apr. 3-7, 2017, 6 pages.

IEEE Standard for Information technology—Telecommunications andinformation exchange between systems Local and metropolitan areanetworks—Specific requirements Part 11 : Wireless LAN MediumAccess Control (MAC) and Physical Layer (PHY)EPO Form 2906 01.91 TRISpecifications; IEEE Std 802.11-2012 (Revision of IEEE Std 802.1,IEEE Standard, IEEE, Piscataway, NJ, USA, Mar. 29, 2012, XP068050195, 2793 pages.

Office Action in European Appln. No. 20880643.0, mailed on Aug. 4, 2023, 9 pages.

Office Action in Indian AppIn. No. 202237024995, dated Sep. 8, 2022, 6 pages (with English translation).

PCT International Search Report and Written Opinion issued in International Application No. PCT/CN2020/125484 on Jan. 19, 2021, 19 pages (with English translation).

Richardson et al., “Efficient Encoding of Low-Density Parity-Check Codes,” IEEE Transactions On Information Theory, vol. 47, No. 2, Feb. 2001, 19 pages.

Syafei et al., “Performance Evaluation and ASIC Design of LDPC Decoder for IEEE802.11n,” 2009 6th IEEE Consumer Communications and Networking Conference, Jan. 2009, 5 pages.

Yofune et al., “IR-harq scheme for multiband WLANsystem”,Proc. 2017 Advances in Wireless and Opticalcommunications (RTUWO), IEEE, Nov. 2, 2017, XP033285058, 117-121.

* cited by examiner

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 10 | 40 | 67 | 55 | 3 | 62 | 5 | 25 | 64 | 43 | 31 | 50 | | 41 | 61 | 26 | 62 | 61 | 19 | | 0 | 0 | | | | | | |
| 58 | 53 | 62 | 47 | 54 | 64 | 48 | 54 | 5 | 13 | 43 | | 54 | | 57 | 7 | 40 | 52 | 45 | 22 | | 0 | 0 | | | | | |
| 43 | 12 | 0 | 67 | 20 | 21 | 35 | 45 | 37 | 59 | 59 | 7 | 56 | 29 | | 48 | | 24 | | 44 | 0 | | 0 | 0 | | | | |
| 13 | 24 | 30 | 34 | 37 | 47 | 49 | 31 | 42 | 20 | | 54 | 3 | 54 | 43 | | 3 | | 61 | 43 | 0 | | | 0 | | | | |
| | | | 25 | | | | | 24 | | | | | | | | | 6 | | | | | | 47 | 0 | | | |
| | | | | 73 | | | 23 | | | | | | | | | 16 | | | | | 49 | | | | 0 | | |
| 30 | | 16 | | | | | | | | | | | 47 | | | | | 19 | | | | | | | | 0 | |
| | | | | | | 65 | | | 40 | | 44 | 0 | | | | | | | | | | | | | | | 0 |

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 10 | 40 | 67 | 55 | 3 | 62 | 5 | 25 | 64 | 43 | 31 | 50 | | 41 | 61 | 26 | 62 | 61 | 19 | | 0 | 0 | | | | | | |
| 58 | 53 | 62 | 47 | 54 | 64 | 48 | 54 | 5 | 13 | 43 | | 54 | | 57 | 7 | 40 | 52 | 45 | 22 | | 0 | 0 | | | | | |
| 43 | 12 | 0 | 67 | 20 | 21 | 35 | 45 | 37 | 59 | 59 | 7 | 56 | 29 | | 48 | | 24 | | 44 | 0 | | 0 | 0 | | | | |
| 13 | 24 | 30 | 34 | 37 | 47 | 49 | 31 | 42 | 20 | | 54 | 3 | 54 | 43 | | 3 | | 61 | 43 | 0 | | | 0 | | | | |
| 60 | 15 | | 34 | 80 | 20 | 29 | 39 | | 22 | | 77 | | 7 | | | | | 7 | | | | | | 0 | | | |
| 72 | | 79 | 69 | 49 | 75 | 8 | | | 2 | | 56 | 22 | | 58 | | | | | | | | | | | 0 | | |
| | 18 | 47 | | 21 | 80 | 38 | 50 | | 75 | | 32 | | | | | | | | | | | | | | | 0 | |
| 21 | 26 | 30 | 36 | 44 | 67 | 63 | 2 | | | | 55 | | | | | | | | | | | | | | | | 0 |

FIG. 4b

LOW-DENSITY PARITY-CHECK (LDPC) ENCODING METHOD AND APPARATUS

CROSS-REFERENCE TO RELATED APPLICATIONS

This application is a continuation of U.S. patent application Ser. No. 17/732,776, filed on Apr. 29, 2022, which is a continuation of International Application No. PCT/CN2020/125484, filed on Oct. 30, 2020, which claims priority to Chinese Patent Application No. 201911047476.X, filed on Oct. 30, 2019. All of the afore-mentioned patent applications are hereby incorporated by reference in their entireties.

TECHNICAL FIELD

Embodiments of this application relate to the field of communications technologies, and in particular, to a low-density parity-check (LDPC) encoding method and an apparatus.

BACKGROUND

To increase a throughput of a communications system, a hybrid automatic repeat request (HARQ) technology is introduced into a next-generation wireless local area network (WLAN) in the new 802.11ax. A principle of HARQ is that: when decoding fails, a receive end stores received data and requires a transmit end to retransmit data, and the receive end first combines the retransmitted data with the previously received data and then performs decoding. In this way, a specific diversity gain is obtained, and a quantity of retransmissions is reduced, thereby reducing a latency. The HARQ technology mainly has two implementations: chase combining (CC)-HARQ and incremental redundancy (IR)-HARQ.

The CC-HARQ technology combines a received error data packet with a retransmitted data packet for decoding, and this improves transmission efficiency. In the IR-HARQ technology, the transmit end may send information bits and initial redundant bits to a peer end during the first transmission. After receiving the information bits and the initial redundant bits, the receive end decodes the information bits based on the initial redundant bits. If the decoding fails, the transmit end retransmits more redundant bits (which alternatively include some of the information bits) to the receive end, so as to reduce a channel coding rate. After receiving the retransmitted redundant bits (which alternatively include some of the information bits), the receive end combines the retransmitted redundant bits (which alternatively include some of the information bits) with the initial bits, and decodes the information bits based on the combined bits. If the decoding fails, the transmit end retransmits redundant bits (which alternatively include some of the information bits) again. As a quantity of retransmissions increases, the redundant bits are continuously accumulated and a corresponding channel coding rate continuously decreases. Therefore, better decoding performance can be obtained.

It can be learned that, when IR-HARQ is executed, new incremental redundant bits need to be introduced during retransmission to reduce a channel coding rate. Currently, a rate-compatible (RC) LDPC code check matrix needs to be introduced, so as to introduce new incremental redundant bits. However, an existing WLAN system supports only 12 LDPC code check matrixes, and there are three code lengths: 648 bits, 1296 bits, and 1944 bits. Each code length supports four different code rates: 1/2, 2/3, 3/4, and 5/6. Each code length and each code rate jointly correspond to one different check matrix, that is, the LDPC code check matrix of each code length is not a rate-compatible check matrix, and is not applicable to introducing new incremental redundant bits in IR-HARQ.

SUMMARY

Embodiments of this application provide an LDPC encoding method and an apparatus, so as to implement IR-HARQ transmission by using a rate-compatible LDPC code check matrix.

To achieve the foregoing objective, the following technical solutions are used in the embodiments of this application.

According to a first aspect, an LDPC encoding method is provided. The method includes: a transmit end obtains k information bits, performs LDPC encoding on the k information bits by using a first check matrix based on a first transmission code rate R satisfying R=k/(n+j×Z), and sends an encoded first codeword including the k information bits and (n−k+j×Z) redundant bits to a receive end, where the first check matrix is a submatrix of the first ((n−k)/Z+j) rows and the first (n/Z+j) columns in a check matrix H, n is an integer greater than 0, j is an integer greater than or equal to 0, and Z is an integer greater than 0; the check matrix H is a matrix of ((n−k)/Z+Q) rows and (n/Z+Q) columns, Q is an integer greater than or equal to j, each element in the check matrix H represents one Z×Z square submatrix, and the square submatrix is a cyclic permutation matrix of an identity matrix or an all-zero matrix; the check matrix H includes a matrix $H_{MC}$, a matrix $H_{IR}$ of Q rows and 24 columns, an all-zero matrix of 4 rows and Q columns, and an identity matrix of Q rows and Q columns; and the matrix $H_{MC}$ is a matrix of (n−k)/Z rows and n/Z columns, the matrix $H_{MC}$ is located at an upper left corner of the check matrix H, the matrix $H_{IR}$ of Q rows and 24 columns is located at a lower left corner of the check matrix H, the all-zero matrix of 4 rows and Q columns is located at an upper right corner of the check matrix H, and the identity matrix of Q rows and Q columns is located at a lower right corner of the check matrix H, that is, the check matrix His a matrix obtained by extending rows and columns of the matrix $H_{MC}$.

It can be learned from the foregoing description that, the check matrix H of a minimum size may have at least (n−k)/Z rows and n/Z columns, that is, the check matrix H of the minimum size may be the matrix $H_{MC}$. In this case, the check matrix H can support a maximum transmission code rate of k/n. The check matrix H of a maximum size may have ((n−k)/Z+Q) rows and (n/Z+Q) columns. In this case, the check matrix H supports a minimum transmission code rate of k/(n+Q×Z). That is, as quantities of rows and columns of the check matrix H change, the check matrix H can support a transmission code rate within a range of [k/(n+Q×Z), k/n] and has a rate compatibility function. Therefore, according to the method in the first aspect, the transmit end may perform, based on a transmission code rate required for sending the information bits, LDPC encoding on the information bits by extracting check bits from a corresponding quantity of rows and a corresponding quantity of columns in the rate-compatible check matrix H, so as to meet a transmission code rate requirement and improve data transmission reliability.

In a possible design, with reference to the first aspect, the method further includes: when transmission of the first codeword fails, the transmit end encodes the k information bits by using a second check matrix based on a second transmission code rate R satisfying R=k/(n+h×Z) to obtain a second codeword, where the second check matrix is a submatrix of the first ((n−k)/Z+h) rows and the first (n/Z+h) columns in the check matrix H, a code rate of the second check matrix is equal to the second transmission code rate, and h is an integer greater than j and less than or equal to Q; and a code length of the second codeword is (n+h×Z), and the second codeword includes the k information bits and (n−k+h×Z) redundant bits; and the transmit end sends incremental redundant bits to the receive end, or sends some of the k information bits and incremental redundant bits to the receive end, where the incremental redundant bits are the $(n-k+j\times Z+1)^{th}$ to the $(n-k+h\times Z)^{th}$ redundant bits in the (n−k+h×Z) redundant bits, and h is an integer greater than j and less than or equal to Q.

Further, if the current retransmission fails, the transmit end retransmits new incremental redundant bits to the receive end again. For a process of retransmitting incremental redundant bits each time, refer to the possible design of the first aspect. Details are not described again.

According to the possible design, the transmit end may extract check bits from corresponding rows and columns in the check matrix H based on a transmission code rate during retransmission, so that the extracted check bits meet a transmission code rate requirement, and the extracted check bits are used to encode the k information bits. Encoded new redundant bits or encoded new redundant bits and some of the encoded information bits are sent to the receive end. In this way, the transmit end retransmits the new incremental redundant bits to the receive end, thereby reducing a channel coding rate and improving decoding performance.

In a possible design, with reference to any one of the first aspect or the possible design of the first aspect, the matrix $H_{IR}$ of Q rows and 24 columns may include any Q rows in a 136-row matrix shown in Table 2 in a specific implementation, for example, may be a matrix of the first Q rows in Table 2, a matrix of the last Q rows in Table 2, a matrix of Q consecutive rows starting from the $q^{th}$ row in Table 2, or a matrix of non-consecutive Q rows starting from the $q^{th}$ row in Table 2, where q is an integer greater than or equal to 1.

In a possible design, with reference to any one of the first aspect or the possible designs of the first aspect, the matrix $H_{IR}$ of Q rows and 24 columns may include any Q rows in a 100-row matrix shown in Table 3 in a specific implementation, for example, may be a matrix of the first Q rows in Table 3, a matrix of the last Q rows in Table 3, a matrix of Q consecutive rows starting from the $q^{th}$ row in Table 3, or a matrix of Q non-consecutive rows starting from the $q^{th}$ row in Table 3, where q is an integer greater than or equal to 1.

Based on the foregoing possible design, the matrix $H_{IR}$ may be obtained from the preset multi-row matrix in Table 2 or Table 3, and the obtained matrix $H_{IR}$ may be used to extend the matrix $H_{MC}$ to obtain the rate-compatible check matrix H.

In a possible design, with reference to any one of the first aspect or the possible designs of the first aspect, the matrix $H_{MC}$ is an LDPC code check matrix with a code length n of 1944 and a code rate of 5/6 in an existing standard.

Based on the possible design, rows and columns of the LDPC code check matrix in the existing standard may be extended to obtain the rate-compatible check matrix, that is, an existing encoding apparatus/decoding apparatus that performs encoding/decoding by using the check matrix with the code length n of 1944 and the code rate of 5/6 may be reused, and a change to the hardware is relatively small.

According to a second aspect, this application provides a communications apparatus. The communications apparatus may be a transmit end, or a chip or a system on chip in the transmit end, or may be a function module that is in the transmit end and that is configured to implement the method according to any one of the first aspect or the possible designs of the first aspect. The communications apparatus may implement functions performed by the transmit end in the foregoing aspect or the possible designs, and the functions may be implemented by hardware executing corresponding software. The hardware or software includes one or more modules corresponding to the foregoing functions. For example, the communications apparatus may include a processing unit and a sending unit.

The processing unit is configured to obtain k information bits and perform LDPC encoding on the k information bits by using a first check matrix based on a first transmission code rate R satisfying R=k/(n+j×Z), where the first check matrix is a submatrix of the first ((n−k)/Z+j) rows and the first (n/Z+j) columns in a check matrix H, n is an integer greater than 0, j is an integer greater than or equal to 0, and Z is an integer greater than 0; the check matrix H is a matrix of ((n−k)/Z+Q) rows and (n/Z+Q) columns, Q is an integer greater than or equal to j, each element in the check matrix H represents one Z×Z square submatrix, and the square submatrix is a cyclic permutation matrix of an identity matrix or an all-zero matrix; the check matrix H includes a matrix $H_{MC}$, a matrix $H_{IR}$ of Q rows and 24 columns, an all-zero matrix of 4 rows and Q columns, and an identity matrix of Q rows and Q columns; and the matrix $H_{MC}$ is a matrix of (n−k)/Z rows and n/Z columns, the matrix $H_{MC}$ is located at an upper left corner of the check matrix H, the matrix $H_{IR}$ of Q rows and 24 columns is located at a lower left corner of the check matrix H, the all-zero matrix of 4 rows and Q columns is located at an upper right corner of the check matrix H, and the identity matrix of Q rows and Q columns is located at a lower right corner of the check matrix H, that is, the check matrix H is a matrix obtained by extending rows and columns of the matrix $H_{MC}$.

The sending unit is configured to send an encoded first codeword including the k information bits and (n−k+j×Z) redundant bits to a receive end.

Specifically, for a specific execution process of each function module in the second aspect, refer to the related descriptions in any one of the first aspect or the possible designs of the first aspect. Details are not described.

According to a third aspect, a communications apparatus is provided. The communications apparatus may be a transmit end, or a chip or a system on chip in the transmit end. The communications apparatus may implement functions performed by the transmit end in the foregoing aspect or the possible designs, and the functions may be implemented by hardware.

In a possible design, the communications apparatus may include a processor and a transceiver. The processor may be configured to support the communications apparatus in implementing the functions in any one of the first aspect or the possible designs of the first aspect. For example, the processor is configured to obtain k information bits, and perform LDPC encoding on the k information bits by using a first check matrix based on a first transmission code rate R satisfying R=k/(n+j×Z), where the first check matrix is a submatrix of the first ((n−k)/Z+j) rows and the first (n/Z+j) columns in a check matrix H, n is an integer greater than 0, j is an integer greater than or equal to 0, and Z is an integer greater than 0; the check matrix H is a matrix of ((n−k)/Z+Q) rows and (n/Z+Q) columns, Q is an integer greater than or equal to j, each element in the check matrix H represents one Z×Z square submatrix, and the square submatrix is a cyclic permutation matrix of an identity matrix or an all-zero matrix; the check matrix H includes a matrix $H_{MC}$, a matrix $H_{IR}$ of Q rows and 24 columns, an all-zero matrix of 4 rows and Q columns, and an identity matrix of Q rows and Q columns; and the matrix $H_{MC}$ is a matrix of (n−k)/Z rows and n/Z columns, the matrix $H_{MC}$ is located at an upper left corner of the check matrix H, the matrix $H_{IR}$ of Q rows and 24 columns is located at a lower left corner of the check matrix H, the all-zero matrix of 4 rows and Q columns is located at an upper right corner of the check matrix H, and the identity matrix of Q rows and Q columns is located at a lower right corner of the check matrix H, that is, the check matrix His a matrix obtained by extending rows and columns of the matrix $H_{MC}$.

In another possible design, the communications apparatus may further include a memory. The memory is configured to store computer-executable instructions that are necessary for the communications apparatus and the check matrix H. When the communications apparatus runs, the processor executes the computer-executable instructions stored in the memory, so that the communications apparatus performs the LDPC encoding method according to any one of the first aspect or the possible designs of the first aspect.

According to a fourth aspect, a computer-readable storage medium is provided. The computer-readable storage medium may be a readable non-volatile storage medium, and the computer-readable storage medium stores instructions. When the instructions are run on a computer, the computer is enabled to perform the LDPC encoding method according to any one of the first aspect or the possible designs of the foregoing aspect.

According to a fifth aspect, a computer program product including instructions is provided. When the instructions are run on a computer, the computer is enabled to perform the LDPC encoding method according to any one of the first aspect or the possible designs of the foregoing aspect.

According to a sixth aspect, a communications apparatus is provided. The communications apparatus may be a transmit end, or a chip or a system on chip in the transmit end. The communications apparatus includes one or more processors and one or more memories. The one or more memories are coupled to the one or more processors. The one or more memories are configured to store computer program code. The computer program code includes computer instructions. When the one or more processors execute the computer instructions, the communications apparatus is enabled to perform the LDPC encoding method according to any one of the first aspect or the possible designs of the first aspect.

For technical effects achieved in any design manner of the second aspect to the sixth aspect, refer to the technical effects achieved in any one of the first aspect or the possible designs of the first aspect. Details are not described again.

According to a seventh aspect, an embodiment of this application further provides a communications system. The communications system includes the communications apparatus and the receive end according to any one of the second aspect to the sixth aspect.

BRIEF DESCRIPTION OF DRAWINGS

FIG. 4*b* shows another check matrix that supports a transmission code rate of 5/7 according to an embodiment of this application;

DESCRIPTION OF EMBODIMENTS

The following describes the method provided in the embodiments of this application with reference to the accompanying drawings.

The technical solutions in the embodiments of this application may be applied to various mobile communications systems supporting IR-HARQ, for example, a universal mobile telecommunications system (UMTS), a worldwide interoperability for microwave access (WiMAX) communications system, a 4th generation (4G) system, a long term evolution (LTE) system, or a 5G (fifth generation, 5G) communications system, a new radio (NR) system, an NR-vehicle-to-everything (V2X) communications system, or another next-generation communications system, and may also be applied to a wireless local area network (WLAN) supporting IR-HARQ, for example, may be applied to any of the Institute of Electrical and Electronics Engineers (IEEE) 802.11 series protocols currently used by WLANs, for example, applied to the 802.11ay standard, or a next-generation standard of 802.11ay. In the embodiments of this application, a WLAN communications system shown in FIG. 1 is used as an example for description.

Figure 1:
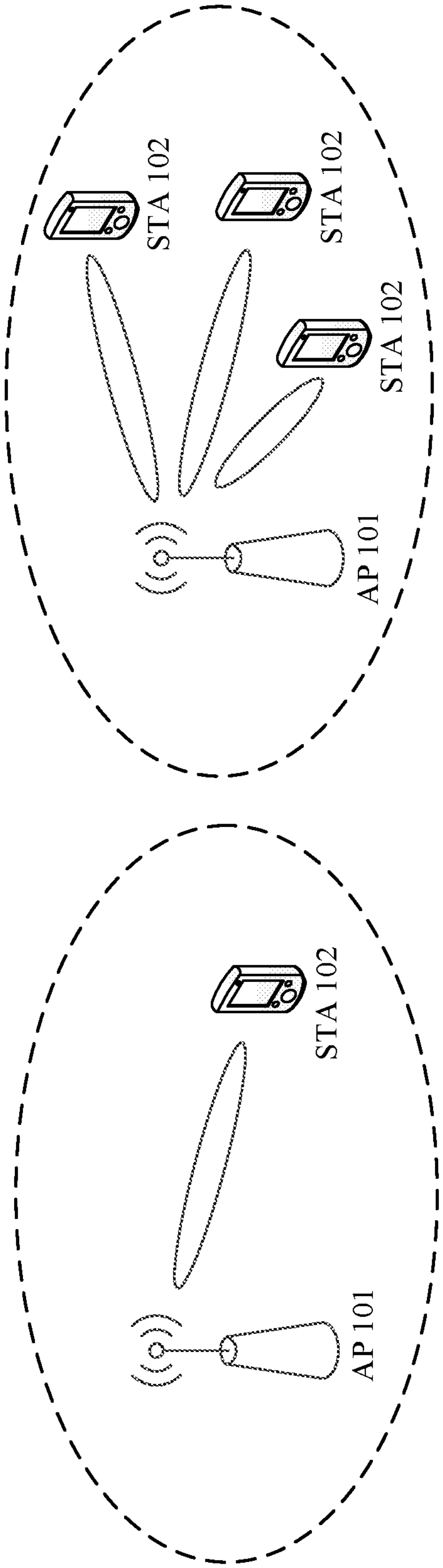
FIG. 1 is a schematic diagram of an application scenario according to an embodiment of this application.

As shown in FIG. 1, the WLAN communications system may include one or more basic service sets (BSSs). Network nodes in the basic service set include an access point (AP) and a station (STA). A transmit end and a receive end in embodiments of this application each may be an AP or a STA in the WLAN system, or may be a chip located in an AP or a STA. Solutions in embodiments of this application may be applied to communication between an AP and a STA, or may be applied to communication between APs, or communication between STAs. The communication may be one-to-one communication, or may be one-to-many communication or many-to-many communication. For example, the communication may be communication between one AP and one STA (for example, as shown in the left diagram of FIG. 1), communication between one AP and a plurality of STAs (as shown in the right diagram of FIG. 1), communication between a plurality of APs and a plurality of STAs, or communication between a plurality of APs and one STA.

The AP is a communications apparatus having a wireless transceiver function, and may be a directional multi-gigabit (DMG) AP, an enhanced directional multi-gigabit (EDMG) AP, or an AP supporting 60 GHz. However, this is not limited in embodiments of this application. The AP may also be referred to as a base station.

The STA may be a communications apparatus having a wireless transceiver function, for example, may be a wireless communications apparatus supporting 60 GHz communication. The STA may also be referred to as a subscriber unit, an access terminal, a mobile station, a remote station, a remote terminal, a mobile device, a user terminal, a terminal, a wireless communications device, a user agent, a user apparatus, or user equipment (UE). Specifically, the STA may be terminal equipment, user equipment (UE), a mobile station (MS), a mobile terminal (MT), or the like. Specifically, the STA may be a mobile phone, a tablet computer, or a computer with a wireless transceiver function, or may be a virtual reality (VR) terminal, an augmented reality (AR) terminal, a wireless terminal in industrial control, a wireless terminal in self-driving, a wireless terminal in telemedicine, a wireless terminal in a smart grid, a wireless terminal in a smart city, a smart home, a vehicle-mounted terminal, or the like.

In the WLAN system shown in FIG. 1, rows and columns of any check matrix (for example, a check matrix with a code length n of 1944 and a code rate of 5/6) in 12 LDPC code check matrixes specified in an existing WLAN standard may be extended to obtain a rate-compatible LDPC code check matrix. A transmit end and a receive end may prestore the rate-compatible LDPC code check matrix. During initial transmission, the transmit end may extract, based on a current transmission code rate, a corresponding submatrix from the rate-compatible LDPC code check matrix to perform LDPC encoding, so that encoded information bits meet the current transmission code rate; and the transmit end may send the encoded information bits to the receive end. Correspondingly, the receive end may extract, based on the current transmission code rate, a corresponding submatrix from the rate-compatible LDPC code check matrix to decode the encoded information bits sent by the transmit end. If the decoding fails, during retransmission, the transmit end may extract, based on a transmission code rate in the retransmission, a corresponding submatrix from the rate-compatible LDPC code check matrix to perform LDPC encoding, so that encoded information bits meet the transmission code rate in the retransmission; and the transmit end sends incremental redundant bits to the receive end. Correspondingly, after receiving the incremental redundant bits, the receive end combines the received incremental redundant bits with a codeword obtained after the previous decoding, for example, appends the received incremental redundant bits to the codeword obtained after the previous decoding to form a new codeword. In addition, the receive end extracts, based on the transmission code rate in the retransmission, a corresponding submatrix from the rate-compatible LDPC code check matrix to decode the new codeword. If the decoding succeeds, the process ends; otherwise, retransmission is performed again. In this way, the rate-compatible LDPC code check matrix may be introduced into the WLAN communications system to implement IR-HARQ transmission and improve transmission performance. Specifically, for the implementation process, refer to descriptions in the embodiment corresponding to FIG. 3.

It should be noted that, in the embodiments of this application, the receive end and the transmit end are relative concepts. The transmit end may refer to a device that performs LDPC encoding on information bits and sends the encoded information bits and/or incremental redundant bits to a peer end. The receive end may refer to a device that receives the LDPC-encoded information bits and/or incremental redundancy bits, and that decodes the received LDPC-encoded information bits. For example, the transmit end may be an AP 101 in the left diagram of FIG. 1, and the receive end may be a STA 102 in the left diagram of FIG. 1.

In addition, FIG. 1 is an example framework diagram. A quantity of nodes included in FIG. 1 is not limited. In addition to the function nodes shown in FIG. 1, the WLAN communications system may further include other nodes, such as a gateway device and an application server. This is not limited. In the embodiments of this application, the transmit end and the receive end each may be a network node in the WLAN communications system, or may be a chip in a network node in the WLAN communications system.

Figure 2:
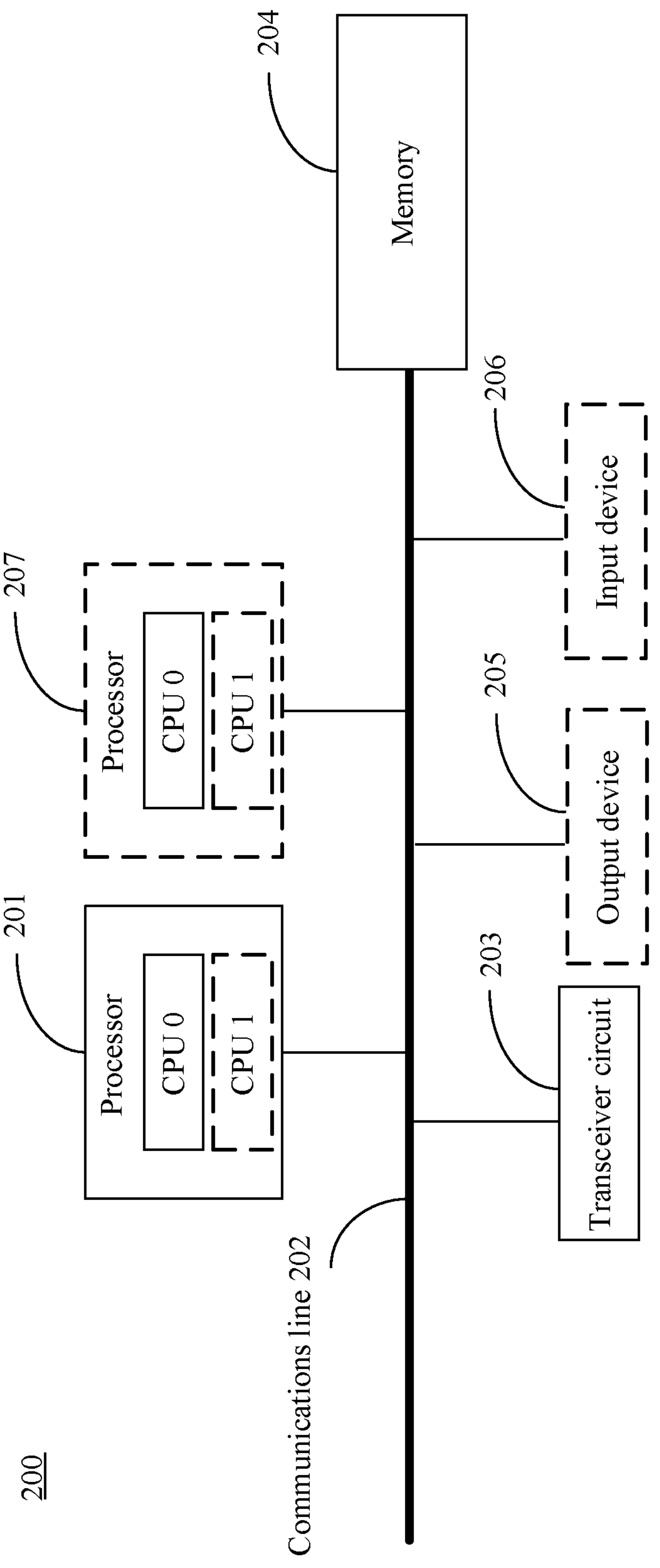
FIG. 2 is a schematic diagram of a communications apparatus according to an embodiment of this application.

A network element shown in FIG. 1, such as an AP or a STA, may use a composition structure shown in FIG. 2 or include a component shown in FIG. 2. FIG. 2 is a schematic diagram of composition of a communications apparatus 200 according to an embodiment of this application. The communications apparatus 200 may be an AP, or a chip or a system-on-a-chip in an AP. As shown in FIG. 2, the communications apparatus 200 may include a processor 201, a communications line 202, and a transceiver circuit 203. Further, the communications apparatus 200 may include a memory 204. The processor 201, the memory 204, and the transceiver circuit 203 may be connected to each other through the communications line 202.

The processor 201 may be a central processing unit (CPU), a general-purpose processor, a network processor (NP), a digital signal processor (digital signal processing, DSP), a microprocessor, a microcontroller, a programmable logic device (PLD), or any combination thereof. The processor 201 may alternatively be another apparatus having a processing function, for example, a circuit, a component, or a software module. The processor 201 may have functions such as encoding, modulation, demodulation, decoding, and the like.

The communications line 202 is used to transmit information between components included in the communications apparatus 200.

The transceiver circuit 203 is configured to communicate with another device or another communications network. The another communications network may be the Ethernet, a radio access network (RAN), a wireless local area network (WLAN), or the like. The transceiver circuit 203 may be a radio frequency module or any apparatus that can implement communication. In this embodiment of this application, only an example in which the transceiver circuit 203 is a radio frequency module is used for description. The radio frequency module may include an antenna, a radio frequency circuit, and the like. The radio frequency circuit may include a radio frequency integrated chip, a power amplifier, and the like.

The memory 204 is configured to store instructions and a rate-compatible LDPC code check matrix. The instruction may be a computer program. The rate-compatible LDPC code check matrix may be a check matrix obtained after rows and columns of an LDPC code check matrix in an existing WLAN standard are extended, for example, may be the following check matrix H of ((n−k)/Z+Q) rows and (n/Z+Q) columns.

The memory 204 may be a read-only memory (ROM) or another type of static storage device that can store static information and/or instructions, or may be a random access memory (RAM) or another type of dynamic storage device that can store information and/or instructions, or may be an electrically erasable programmable read-only memory (EEPROM), a compact disc read-only memory (CD-ROM) or another optical disk storage, an optical disc storage, a magnetic disk storage medium, or another magnetic storage device. The optical disc storage includes a compact disc, a laser disc, an optical disc, a digital versatile disc, a Blu-ray disc, and the like.

It should be noted that the memory 204 may exist independently of the processor 201, or may be integrated with the processor 201. The memory 204 may be configured to store instructions, program code, some data, or the like. The memory 204 may be located inside the communications apparatus 200, or may be located outside the communications apparatus 200. This is not limited. The processor 201 is configured to execute the instructions stored in the memory 204, to implement an LDPC encoding method provided in the following embodiments of this application.

In an example, the processor 201 may include one or more CPUs, for example, a CPU 0 and a CPU 1 in FIG. 2.

In an optional implementation, the communications apparatus 200 includes a plurality of processors. For example, in addition to the processor 201 in FIG. 2, the communications apparatus 200 may further include a processor 207.

In an optional implementation, the communications apparatus 200 further includes an output device 205 and an input device 206. For example, the input device 206 is a device, for example, a keyboard, a mouse, a microphone, or a joystick, and the output device 205 is a device, for example, a display screen or a speaker.

It should be noted that the communications apparatus 200 may be a desktop computer, a portable computer, a network server, a mobile phone, a tablet computer, a wireless AP, an embedded device, a chip system, or a device with a structure similar to that in FIG. 2. In addition, the composition structure shown in FIG. 2 does not constitute a limitation on the communications apparatus. In addition to the components shown in FIG. 2, the communications apparatus may include more or fewer components than those shown in the figure, or have different component arrangements, or some components are combined.

In embodiments of this application, the chip system may include a chip, or may include a chip and another discrete component.

The following describes an LDPC encoding method provided in an embodiment of this application with reference to the WLAN communications system shown in FIG. 1. Each device in the following embodiments may have the components shown in FIG. 2. For actions, terms, and the like used in embodiments of this application, reference may be made to each other. In embodiments of this application, a name of a message exchanged between devices, a name of a parameter in the message, or the like is merely an example. During specific implementation, another name may alternatively be used. This is not limited.

Figures 3, 4A:
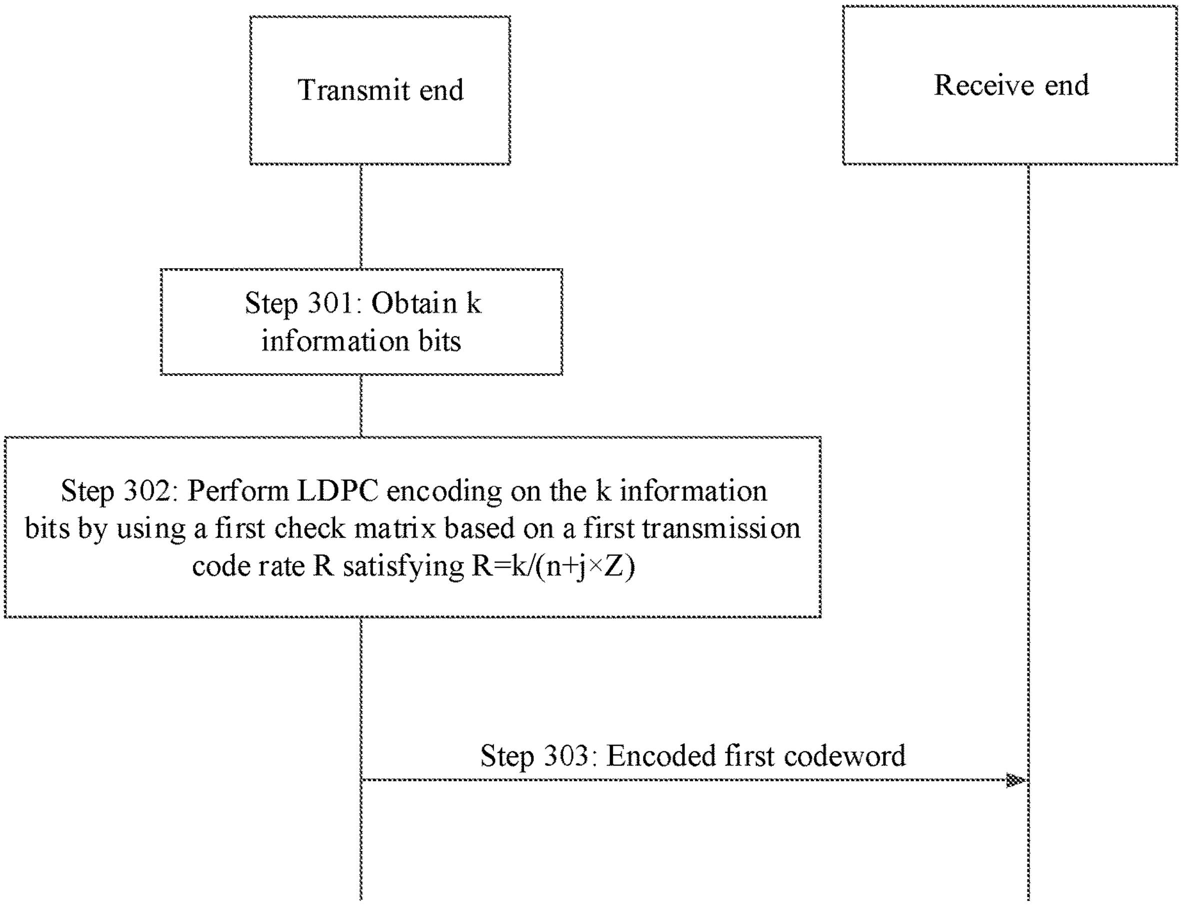
FIG. 3 is a flowchart of an LDPC encoding method according to an embodiment of this application.
FIG. 4*a* shows a check matrix that supports a transmission code rate of 5/7 according to an embodiment of this application.

FIG. 3 shows an LDPC encoding method according to an embodiment of this application. As shown in FIG. 3, the method may include the following steps.

Step 301: A transmit end obtains k information bits.

The transmit end may be an AP 101 or a STA 102 in FIG. 1. This is not limited.

k is an integer greater than 0. For example, a value of k may be 81×20=1620 in this embodiment of this application.

The k information bits may all be valid payload bits or valid information bits. Alternatively, some bits may be valid payload bits or valid information bits, and remaining bits may be padding bits or shortened all-zero padding bits. The valid payload bits and the remaining bits together form the k to-be-encoded information bits. For example, the k information bits may include (k−s) valid information bits and s shortened all-zero padding bits.

For example, a baseband module in the transmit end may generate valid information bits. A length of the valid information bits may be less than or equal to k. The transmit end may obtain the k information bits based on the valid information bits generated by the baseband module. For example, if a quantity of the valid information bits is k, LDPC encoding is directly performed on the valid information bits generated by the baseband module; or if the quantity of the valid information bits generated by the baseband module is less than k, all-zero padding is performed on the valid information bits to obtain the k information bits.

Step 302: The transmit end performs LDPC encoding on the k information bits by using a first check matrix based on a first transmission code rate R satisfying R−k/(n+j×Z).

The first transmission code rate may be a rate at which the transmit end transmits information to a receive end this time. The first transmission code rate may be any one of transmission code rates predefined in a WLAN standard. Specifically, the transmit end may select, based on a communications environment between the transmit end and the receive end and another parameter, one code rate from the transmission code rates predefined in the WLAN standard as the first transmission code rate. The transmission code rates predefined in the WLAN standard may include 1/2, 2/3, 3/4, 5/6, 5/7, 7/8, and the like.

The first check matrix is a submatrix of the first ((n−k)/Z+j) rows and the first (n/Z+j) columns in a check matrix H, and a code rate of the first check matrix is equal to the first transmission code rate. It should be noted that, that the transmit end performs LDPC encoding on the k information bits by using a first check matrix may specifically be: the transmit end expands each element in the first check matrix based on a Z×Z square submatrix, and the transmit end performs LDPC encoding on the k information bits based on a parity check matrix of ((n−k)+j×Z) rows and (n+j×Z) columns that is obtained by expansion. For example, the transmit end may perform LDPC encoding on the k information bits by using the parity check matrix of (n−k)+j×Z) rows and (n+j×Z) columns by referring to a conventional technology. Details are not described.

n is an integer greater than 0, for example, n may be 1944; j is an integer greater than or equal to 0; and Z is an integer greater than 0, for example, Z may be 81. It should be noted that, the first transmission code rate R is not limited to 5/6, and may alternatively be 5/7, 2/3, or the like. For example, Z=81. When k=1620, n=1944, and j=0, R=5/6. When k=1620, n=1944, and j=4, R=5/7.

The check matrix H may be a matrix obtained by extending an LDPC code check matrix of ((n−k)/Z) rows and (n/Z) columns in an existing WLAN standard by Q rows and Q columns. For example, the check matrix H may be a matrix of ((n−k)/Z+Q) rows and (n/Z+Q) columns. Q is an integer greater than or equal to j, for example, Q may be 100. The check matrix supports a minimum transmission code rate of k/(n+Q×Z), and a maximum transmission code rate of k/n. When Q=100, n=1944, k=1620, and Z=81, the minimum transmission code rate of the check matrix His 0.161, and the maximum transmission code rate supported by the check matrix His 5/6. In actual application, to implement any transmission code rate within a range of [0.161, 5/6], a submatrix at an upper left corner of the check matrix H may be extracted, so that the extracted submatrix supports the transmission code rate that needs to be implemented.

For example, the check matrix H may be a mother matrix or a base matrix of a parity check matrix of (n−k+Q×Z) rows and (n+Q×Z) columns. Each element in the check matrix H represents one Z×Z square submatrix. The square submatrix is a cyclic permutation matrix of an identity matrix or an all-zero matrix. The all-zero matrix may also be described as a zero submatrix with all-zero entries. That is, the parity check matrix of (n−k+Q×Z) rows and (n+Q×Z) columns may be divided into square submatrixes whose size is Z×Z to obtain the check matrix H, or Z×Z submatrixes corresponding to all elements in the check matrix H may be expanded to obtain the parity check matrix of (n−k+Q×Z) rows and (n+Q×Z) columns.

In this embodiment of this application, the identity matrix may be denoted as P0. A matrix obtained by cyclically permutating the identity matrix P0 rightward by i elements is referred to as a cyclic permutation matrix (CPM). A subscript i of the cyclic permutation matrix CPM indicates a quantity of bits by which the identity matrix is cyclically permutated rightward. For example, P0 may be shown by matrix (1):

$$\begin{bmatrix} 1 & 0 & \ldots & 0 & 0 \\ 0 & 1 & \ldots & 0 & 0 \\ \vdots & \vdots & \ddots & \vdots & \vdots \\ 0 & 0 & \ldots & 1 & 0 \\ 0 & 0 & \ldots & 0 & 1 \end{bmatrix} \quad \text{matrix (1)}$$

The identity matrix P0 may be cyclically permutated rightward by one element to obtain a cyclic permutation matrix P1. P1 is shown by matrix (2). Similarly, the identity matrix may be cyclically permutated rightward by 2 elements to obtain a cyclic permutation matrix P2, and cyclically permutated rightward by 3 elements to obtain a cyclic permutation matrix P3, . . . , until the identity matrix is cyclically permutated rightward by 80 elements to obtain a cyclic permutation matrix P80.

$$\begin{bmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 0 \\ 1 & 0 & 0 & \ldots & 0 \end{bmatrix} \quad \text{matrix (2)}$$

matrix $H_{MC}$. Extracting elements in the first ((n−k)/Z+j) rows and the first (n/Z+j) columns of the check matrix H may be: extracting a submatrix from the first row to the ((n−k)/Z+j)$^{th}$ row and from the first column to the (n/Z+j)$^{th}$ column in the check matrix H. Z×Z square submatrixes corresponding to all elements in the first check matrix of (n−k)/Z+j) rows and (n/Z+j) columns may be expanded to obtain a parity check matrix of (n−k+j×Z) rows and (n+j×Z) columns.

For example, Q=100, (n−k)/Z=4, and n/Z=24. The check matrix may be shown by matrix (3). If the first transmission code rate is 5/6, n=1944, and Z=81, the submatrix $H_{MC}$ from the first row to the fourth row and from the first column to the 24$^{th}$ column in matrix (3) is extracted as the first check matrix.

$$H = \begin{bmatrix} H_{MC} & 0_{4\times 100} \\ H_{IR} & I_{100\times 100} \end{bmatrix} \quad \text{matrix (3)}$$

In this embodiment of this application, the matrix $H_{MC}$ may be any one of 12 LDPC code check matrixes adopted in the existing Institute of Electrical and Electronics Engineers (IEEE) 802.11ac/802.11ax standard. The 12 LDPC code check matrixes include code lengths of 648, 1296, and 1944. Each code length supports check matrixes with four different code rates: 1/2, 2/3, 3/4, and 5/6. For example, an example in which the matrix $H_{MC}$ is a check matrix with the code length of 1944 and the code rate of 5/6 shown in Table 1 is used for description in this embodiment of this application. For a process in which another existing check matrix is used as the matrix $H_{MC}$, and rows and columns of the another existing check matrix are extended to obtain the check matrix H, refer to the method described in this embodiment of this application. Details are not described again.

TABLE 1

| | | | | | | | | | | | | | | | | | | | | | | | |
|---|---|---|---|---|---|---|---|---|---|---|---|---|---|---|---|---|---|---|---|---|---|---|---|
| 10 | 40 | 67 | 55 | 3 | 62 | 5 | 25 | 64 | 43 | 31 | 50 | | 41 | 61 | 26 | 62 | 61 | 19 | | 0 | 0 | | |
| 58 | 53 | 62 | 47 | 54 | 64 | 48 | 54 | 5 | 13 | 43 | | 54 | | 57 | 7 | 40 | 52 | 45 | 22 | | 0 | 0 | |
| 43 | 12 | 0 | 67 | 20 | 21 | 35 | 45 | 37 | 59 | 59 | 7 | 56 | 29 | | 48 | | 24 | | 44 | 0 | | 0 | 0 |
| 13 | 24 | 30 | 34 | 37 | 47 | 49 | 31 | 42 | 20 | | 54 | 3 | 54 | 43 | | 3 | | 61 | 43 | 0 | | | 0 |

In this embodiment of this application, the check matrix H may be specified in the IEEE 802.11ac/ax standard, and prestored at the transmit end. The check matrix may include a matrix $H_{MC}$, a matrix $H_{IR}$ of Q rows and 24 columns, an all-zero matrix of 4 rows and Q columns, and an identity matrix of Q rows and Q columns; and the matrix $H_{MC}$ is a check matrix of (n−k)/Z rows and n/Z columns, the matrix $H_{MC}$ is located at the upper left corner of the check matrix H, the matrix $H_{IR}$ of Q rows and 24 columns is located at a lower left corner of the check matrix H, the all-zero matrix of 4 rows and Q columns is located at an upper right corner of the check matrix H, and the identity matrix of Q rows and Q columns is located at a lower right corner of the check matrix H, that is, the check matrix H may be considered as a matrix obtained by extending rows and columns of the The matrix $H_{IR}$ of Q rows and 24 columns may be obtained from a matrix shown in Table 2 or Table 3 below.

In an example, the matrix $H_{IR}$ of Q rows and 24 columns is any Q-row matrix in the 136-row matrix shown in Table 2 below. Each row in the preset 136-row matrix includes 24 elements, each element represents one square submatrix whose size is Z×Z, a null element in each row represents an all-zero matrix, and a specific value of a non-null element in each row is a cyclic permutation value of an identity matrix. It should be noted that, if each entry in the 136-row matrix shown in Table 2 is expanded into a Z×Z square submatrix, the 136-row matrix shown in Table 2 may further be replaced by a parity check matrix of 136×Z rows and 24×Z columns.

The matrix $H_{IR}$ of Q rows and 24 columns is any Q-row matrix in the 136-row matrix shown in Table 2 below, and this may indicate that the matrix $H_{IR}$ of Q rows and 24 columns is a matrix of the first Q rows, a matrix of the last Q rows, a matrix of Q consecutive rows starting from the $q^{th}$ row, or a matrix of Q non-consecutive rows starting from the $q^{th}$ row in the 136-row matrix below, where q is an integer greater than or equal to 1.

TABLE 2

| | | | | | | | | | | | | | | | | | | | | | | | |
|---|---|---|---|---|---|---|---|---|---|---|---|---|---|---|---|---|---|---|---|---|---|---|---|
| | | | 25 | | | | | 24 | | | | | | | | | 6 | | | | | | 47 |
| | | | | 73 | | | 23 | | | | | | | | | 16 | | | | | 49 | | |
| 30 | | 16 | | | | | | | | | | | 47 | | | | | 19 | | | | | |
| | | | | | | 65 | | | 40 | | 44 | 0 | | | | | | | | | | | |
| | | | | | 60 | | | | | | | | | 71 | | | | | 56 | 53 | | | |
| | 55 | | | | | | | | | 24 | | | | | 55 | | | | | | | 39 | |
| | | | 79 | | | | 68 | | 14 | | | | 43 | | | | | | | | | | |
| | 71 | | | | | | | | | | | | | | 18 | 8 | | | | 25 | | | |
| | | 18 | | 16 | | | | | | | | | | 73 | | | | | | | | 35 | |
| | | | | | | | | | | 17 | 53 | | | | | | | 30 | | | | | 13 |
| | | | | | | 57 | | | | | | 47 | | | | | 52 | | | | 5 | | |
| 78 | | | | | 13 | | | 31 | | | | | | | | | | | 77 | | | | |
| | | 13 | | | | | | | | | | 10 | | 53 | | | 23 | | | | | | |
| 66 | | | | | | | | | 48 | | | | 71 | | | | | | | | | | 11 |
| | | | 4 | | | | | | | | 66 | | | | | | | | 10 | 9 | | | |
| | | | | | | | | | | | | | | | 10 | 37 | | | | | 18 | 52 | |
| | 68 | | | 2 | 43 | | | | | 75 | | | | | | | | | | | | | |
| | | | | | | 73 | 12 | 55 | | | | | | | | | | 29 | | | | | |
| | | 33 | | | | | | | | | | | 49 | | | | | 0 | | | | | 69 |
| 62 | | | | 55 | | | | | 33 | | 4 | | | | | | | | | | | | |
| | 51 | | | | | | 39 | | | | | | | | | 24 | | | | 33 | | | |
| | | | | | 7 | | | | | | | | | | 42 | | | | 80 | | | 31 | |
| | | | | | | 60 | | | | 52 | | 44 | | | | | 69 | | | | | | |
| | | | 41 | | | | | 19 | | | | | | 37 | | | | | | | 10 | | |
| | 61 | | | | | 28 | | | | | 9 | | | | | | | | | | 27 | | |
| | | | 49 | | | | 61 | | | | | | | | | 54 | 30 | | | | | | |
| | | 69 | | 56 | | | | | | | | | | | 18 | | | | 24 | | | | |
| 68 | | | | | 39 | | | | 34 | | | | 49 | | | | | | | | | | |
| | | | | | | | | | | | | 47 | | | | | | 40 | | 35 | | 43 | |
| | | | | | | | | 72 | | 27 | | | | 45 | | | | | | | | | 52 |
| | | | | 34 | | | 55 | 9 | 33 | | | | | | | | | | | | | | |
| | | | | | 58 | | | | | | | | | | | 68 | 77 | | | | 38 | | |
| | 52 | | 51 | | | 45 | | | | | | | | | | | | 40 | | | | | |
| 40 | | | | | | | | | | 20 | | 19 | | 71 | | | | | | | | | |
| | | | | | | | | | | | 4 | | 9 | | 62 | | | | 26 | | | | |
| | | 26 | | | | | | | | | | | | | | | | | | 61 | | 45 | 60 |
| | 21 | | | | | | 6 | | | | | | | | 63 | | | | 53 | | | | |
| 79 | | | | 4 | | | | | | | | 74 | | | | | | | | | 19 | | |
| | | | | | | | | | | 57 | 40 | | | | | | | 16 | | | | | 28 |
| | | 65 | 37 | | | 43 | | | | | | | | | | | | | | | | 40 | |
| | | | | | 52 | | | | 51 | | | | 78 | 79 | | | | | | | | | |
| | | | | | | | | 60 | | | | | | | | 11 | 40 | | | 52 | | | |
| | | | | 79 | | | | 46 | | | 70 | | | | 51 | | | | | | | | |
| | 70 | | | | 80 | | | | | | | | | 20 | | 42 | | | | | | | |
| | | | | | | | 58 | | | | | | 6 | | | | | | | | | 4 | 14 |
| | | | 31 | | | | | | | | | | | | | | 80 | 5 | 20 | | | | |
| | | | | | | 68 | | | | 37 | | | | | | | | | | 32 | 75 | | |
| 28 | | 74 | | | | | | | 42 | | | 16 | | | | | | | | | | | |
| 75 | 80 | | 63 | | | | | | | 35 | | | | | | | | | | | | | |
| | | | | | 52 | | | 14 | | | | | | | | | 62 | | | | | | 8 |
| | | | | | | | 29 | | | | | | | | | | | 45 | 26 | | | 57 | |
| | | 56 | | 24 | | | | | | | 40 | | | | | | | | | 33 | | | |
| | | | | | | | | | 51 | | | | 17 | | | 32 | | | | | 80 | | |
| | | | | | | 2 | | | | | | 49 | | 78 | 12 | | | | | | | | |
| | | | | | 24 | | | | | | | | | | | | | | 55 | | | 34 | 80 |
| | | | | | | 4 | | | | 36 | | 24 | | | 64 | | | | | | | | |
| 20 | | | | | | | | | | | 56 | | 38 | | | | | | | 77 | | | |
| | | | | | | | 50 | | 47 | | | | | 21 | | 34 | | | | | | | |
| | | | | 65 | | | | 69 | | | | | | | | | | 17 | | | 44 | | |
| | 59 | 63 | 10 | | | | | | | | | | | | | | 55 | | | | | | |
| | | | | | | | | | | | 58 | 68 | | 30 | | | | | 69 | | | | |
| | 7 | 11 | | | | | | | | | | | | | 59 | | | 25 | | | | | |
| | | | 76 | | | | | | | | | | 8 | | | | | | | | 39 | 11 | |
| 49 | | | | | | 67 | | | 39 | | | | | | | 26 | | | | | | | |
| | | | | | 57 | | 73 | | | 24 | | | | | | | | | | 45 | | | |
| | | | | 42 | | | | 1 | | | | | | | | | 60 | | | | | | 73 |
| | | | | 73 | | | | | | | | | | | 56 | | | 77 | 10 | | | | |
| | | 3 | | | | | | 39 | | | | | | | | | 61 | | | | | | 44 |
| 70 | | | | | 68 | | | | | 7 | | | | | | | | | | 43 | | | |
| | | | | | | 78 | | | | | | 20 | 55 | | | | | | | | | 76 | |
| | 3 | | 37 | | | | | | | | 59 | | | 7 | | | | | | | | | |
| | | | | | | | 38 | | 70 | | | | | | | 64 | | | | | 41 | | |
| | | | | | | 63 | | | | | | | | | 31 | 63 | | | | 2 | | | |
| | | | 5 | | 60 | | | | | | | | | | | | | 78 | 57 | | | | |

TABLE 2-continued

| | | | | | | | | | | | | | | | | | | | | | | | |
|---|---|---|---|---|---|---|---|---|---|---|---|---|---|---|---|---|---|---|---|---|---|---|---|
| | | | | | | | | 10 | | | | 67 | | 17 | | | | | | | | | 17 |
| | | 0 | | | | | | | | | 46 | | 59 | | | | | | | | | 51 | |
| 7 | 33 | | | 22 | | | | | 27 | | | | | | | | | | | | | | |
| | | | | | | | 4 | | | 19 | | | | | | | 9 | | | | 6 | | |
| | | | | | 0 | | | 43 | | | | | | | | | 38 | | | | 64 | | |
| | 5 | | | | | | | | | | 63 | 73 | | | | 55 | | | | | | | |
| | | | | 7 | | 44 | | | | | | | | | | | | 12 | | 21 | | | |
| | | 31 | | | | | | | | | | | 28 | 57 | | | | | | | | 2 | |
| 28 | | | 32 | | | | | | 65 | | | | | | 45 | | | | | | | | |
| | | | | | | | 2 | | | 41 | | | | | | | | | 53 | | | | 60 |
| | 62 | | | | | | | | | | | 67 | | | | | | | | | | 65 | 56 |
| 17 | | | | | | | | | | | | | | | 14 | | | | | 53 | 1 | | |
| | | | | | 20 | | | | | | | | 31 | | | | 34 | | 21 | | | | |
| | | | 0 | | | | | 65 | 63 | | | | | 32 | | | | | | | | | |
| | | | | | | 14 | 39 | | | | 11 | | | | | | | 58 | | | | | |
| | | 18 | | 75 | | | | | | 43 | | | | | | 74 | | | | | | | |
| | | | | | | | 25 | | | | | | 75 | | 0 | | | | | | | | 65 |
| | | | 6 | | | | | | | | | | | | | 80 | 67 | | | | 16 | | |
| | | | | | | 58 | | 76 | | | | | | | | | | 2 | | | | 76 | |
| | | 2 | | | | | | | | | 70 | | | 70 | | | | | 19 | | | | |
| 5 | | | | | 26 | | | | | | | 61 | | | | | | | | 46 | | | |
| | 16 | | | 70 | | | | | 20 | 73 | | | | | | | | | | | | | |
| | | 21 | | | 66 | | 29 | | | | | 50 | | | | | | | | | | | |
| | | | | 7 | | | | 50 | | | | | 78 | | | | | 7 | | | | | |
| 51 | | | | | | 16 | | | 75 | | | | | | | | | | | | | 69 | |
| | 61 | | | | | | | | | | | | | | | 77 | | | | | 35 | | 36 |
| | | | | | | | | | | 4 | 41 | | | | | | | | 73 | 14 | | | |
| | | | 17 | | | | | | | | | | | 20 | 4 | | 17 | | | | | | |
| | | | | | | | | | 76 | | | | | 23 | | | 68 | | | 8 | | | |
| 6 | | | | | | | | | | | 52 | | | | 70 | 55 | | | | | | | |
| | | | | | 37 | | | 50 | | 44 | | | | | | | | 6 | | | | | |
| | 54 | 16 | 55 | | | | 14 | | | | | | | | | | | | | | | | |
| | | | | 51 | | 63 | | | | | | | 70 | | | | | | | | | 65 | |
| | | | | | | | | | | | | 13 | | | | | | | 25 | | 64 | | 4 |
| | 74 | | | | | | 80 | | | 79 | | 45 | | | | | | | | | | | |
| | | | | | | | | | 48 | | | | | | | | 58 | | | | 34 | | 25 |
| | | | | 34 | | | | | | | | | | 52 | 30 | | | | 10 | | | | |
| | | | 16 | | | | | 36 | | | 30 | | | | | | | 65 | | | | | |
| 54 | | | | | 41 | | | | | | | | | | | 73 | | | | 53 | | | |
| | | 8 | | | | 51 | | | | | | | 56 | | | | | | | | | 30 | |
| | | 5 | | | | | | | | 43 | | | | | | | | | 69 | | 55 | | |
| | 42 | | | | | | | | 14 | | | 7 | | | | | 74 | | | | | | |
| | | | | | | | 47 | | | | | | | 63 | | 21 | | | | | | | 74 |
| 20 | | | | | 11 | 8 | | | | | | | | | | | | | | | | 38 | |
| | | | 60 | 75 | | | | 73 | | | | | | | | | | 40 | | | | | |
| | | | | | | | | | | | 29 | | 14 | | 44 | | | | | 73 | | | |
| | | | | 41 | | | | | | | 9 | | | | | | | | | 62 | 24 | | |
| | | | | | 25 | | 9 | | 39 | | | | | 6 | | | | | | | | | |
| | | | | | | 33 | | 17 | | 66 | | | | | | 68 | | | | | | | |
| | 72 | | | | | | | | | | | | | | 74 | | | | 58 | | | | 44 |
| | | | 68 | | | | | | | | | 1 | | | | | | 76 | | | | 71 | |
| 1 | | 70 | | | | | | | | | | | 44 | | | | 13 | | | | | | |
| | | 74 | | | | | | | | | | | 16 | | | | | | | 48 | | 50 | |
| | 51 | | 56 | | | | | | | | | | | | 53 | | | | | | 72 | | |
| | | | | | | | | 12 | | | 70 | | | 80 | | | | 1 | | | | | |
| 4 | | | | | | 36 | 30 | | | | | | | | | | | | 44 | | | | |
| | | | | 27 | 42 | | | | | 50 | | | | | | | | | | | | | 45 |
| | | | | | | | | | 79 | | | 64 | | | | 62 | 79 | | | | | | |
| | | | 59 | | | | | | | | | | | | 76 | | | | | | 42 | | |
| | | | | | | | | | 71 | | | | | 17 | | | | | | | | 14 | 58 |
| 31 | | | | | 44 | | 21 | | | | | | | | | | 56 | | | | | | |
| | | | | 10 | | | | 74 | | | | | 54 | | | 8 | | | | | | | |

In another example, the matrix $H_{IQ}$ of Q rows and 24 columns is any Q-row matrix in the 100-row matrix shown in Table 3 below. Each row in the preset 100-row matrix includes 24 elements, each element represents one square submatrix whose size is Z×Z, a null element in each row represents an all-zero matrix, and a specific value of a non-null element in each row is a cyclic permutation value of an identity matrix. It should be noted that, if each element shown in Table 3 is expanded into a Z×Z square submatrix, the 100-row matrix shown in Table 3 may further be replaced by a parity check matrix of 100×Z rows and 24×Z columns.

The matrix $H_{IR}$ of Q rows and 24 columns is any Q-row matrix in the 100-row matrix shown in Table 2 below, and this may indicate that the matrix $H_{IR}$ of Q rows and 24 columns is a matrix of the first Q rows, a matrix of the last Q rows, a matrix of Q consecutive rows starting from the $q^{th}$ row, or a matrix of Q non-consecutive rows starting from the $q^{th}$ row in the 100-row matrix below, where q is an integer greater than or equal to 1.

TABLE 3

| | | | | | | | | | | | | | | | | | | | | | | | |
|---|---|---|---|---|---|---|---|---|---|---|---|---|---|---|---|---|---|---|---|---|---|---|---|
| 60 | 15 | | 34 | 80 | 20 | 29 | 39 | | 22 | | 77 | 7 | | | | | | 7 | | | | | |
| 72 | | 79 | 69 | 49 | 75 | 8 | | | 2 | | 56 | 22 | | 58 | | | | | | | | | |
| | 18 | 47 | | 21 | 80 | 38 | 50 | | 75 | | 32 | | | | | | | | | | | | |
| 21 | 26 | 30 | 36 | 44 | 67 | 63 | 2 | | | | 55 | | | | | | | | | | | | |
| 18 | | 63 | 78 | 44 | | 67 | | 14 | 35 | | 73 | | | 9 | | | | | | | | | |
| | 56 | 5 | 9 | | 45 | 67 | 50 | | 25 | | | | | | | | 8 | | 53 | | | | |
| 45 | 28 | | 50 | 62 | | 34 | 8 | | 4 | | | | | | | | | | | 76 | | | |
| | | 80 | 50 | 13 | 40 | 32 | | | 0 | 20 | | | | | | | | | | | | | |
| | 47 | 38 | 55 | 45 | | 67 | 71 | | 57 | | | | | | | | | | | | | | 38 |
| | 47 | 79 | 7 | 76 | | 27 | | | 33 | | | | | | | | | | | | 49 | | |
| | 58 | 19 | 26 | 31 | 39 | | | | 68 | | | | | | 17 | | | | | | | | |
| | | 6 | 76 | | 24 | 69 | 3 | | | | | | | | | 43 | | | | | | | |
| | 40 | | 34 | | | 37 | 42 | | 1 | | | | 10 | | | | | | | | | | |
| | 59 | 47 | 66 | | | 63 | | | 74 | | | | | | | | 26 | | | | | | |
| | | 47 | 3 | 53 | 67 | | 67 | | | | | | | | | | | | | | | 46 | |
| | | | 69 | 56 | 35 | 36 | | | 54 | | | | | | | | | 17 | | | | | |
| | | | 7 | | | 26 | 77 | | 24 | | | | | | | 43 | | | | | | 32 | |
| | 36 | 9 | 76 | | | 3 | | 78 | | | | | | | | | | | | | | | |
| | 14 | 45 | | | | 0 | 59 | | | | | | | | | | | | 39 | | | | |
| | 4 | | 4 | | | 54 | | 31 | | | | | 31 | | | | | | | | | | |
| | 48 | 39 | 33 | | | 32 | | | | 34 | | | | | | | | | | | | | |
| | 46 | | | 47 | | 6 | | | | | | | 69 | | | | | | | 22 | | | |
| | 66 | | 64 | | | 10 | | | 77 | | | | | | | | | | | | | | 42 |
| | 23 | 62 | | | | 65 | | | | | | | | | 43 | 43 | | | | | | | |
| | 6 | 48 | 16 | | | 29 | | | | | | 23 | | | | | | | | | | | |
| | | 3 | 11 | | | 44 | | 34 | | | | | | | | 70 | | | | | | | |
| | 59 | 49 | 16 | | | | | | | | | | | 1 | | | | | | | | | |
| | | 77 | 19 | | | 8 | | | | | | | 10 | | | | | | | | 17 | | |
| | 44 | 20 | 18 | | | | | | | | | | | 17 | | | | | 17 | | | | |
| | | | 71 | | | 16 | | | 4 | 69 | | | | | | | | | | | | | |
| | | 27 | 18 | | | | | | | | | 36 | | 0 | | | | | | | | | |
| | 52 | | 43 | | | 42 | | 39 | | | | | | | | | | | | 56 | | | |
| | 31 | | | | | 14 | | 50 | | | | | | | | | | | | | | 9 | |
| | | | 22 | | | 38 | | | 64 | | | | | | | | | 80 | | | | | |
| | 43 | 80 | 59 | | | | | | | | | | | | | | 34 | | | | | | |
| | | 48 | 31 | | | 22 | | | | | | | | | 77 | 71 | | | | | | | |
| | | | 21 | | | 54 | | | | 41 | | | 65 | | | | | | | | | | |
| | | | 58 | | | 78 | | | | | | | | 47 | | | | 56 | | | | | |
| | 70 | | 21 | | | 13 | | | | | 8 | | 41 | | | | | | | | | | |
| | 22 | | | | | 19 | | | | | | | | | | | | 63 | | | 74 | | |
| | 59 | 58 | | | | 17 | | | | | | 14 | | | | | | | | | | | |
| | 59 | | 72 | | | 32 | | | | | | | | | 29 | | | | | 29 | | | |
| | 71 | 79 | | | | | | | | | | | | 21 | | | | | | 24 | | | |
| | | 46 | 46 | | | | | | | | | | | | | 19 | 51 | | | | | | |
| | 53 | 75 | | | | | | | | | | | 34 | | | | | | | | | 28 | |
| 79 | 24 | 34 | | | | | | 64 | | | | | | | | | | | | | | | |
| | 73 | 25 | | | | | | | | 49 | | | | | | | | | | | | | |
| | 48 | 18 | | | | | | | | | | | | | | | 64 | | 72 | | | | |
| 41 | | 41 | | | | | | | | 1 | | | | | | | | | | | | | |
| | 32 | | | | | | | | | | | 74 | | | 45 | | | | | | | | |
| | | 9 | | | | | | | | | | 50 | | | | | | | 25 | | | | |
| | 72 | 18 | | | | | | | | | | 75 | | | | | | | | | 11 | | |
| 40 | 34 | 43 | | | | | | | | | | | | | | | | | | | | | |
| | 57 | 71 | | | | | | 76 | | | 29 | | | | | | | | | | | | |
| 74 | | | | | | | | | | 67 | | | | | 54 | | | | | | | | |
| | | | | | | | 5 | 23 | | | | | | 66 | | | | | | | | | |
| | | | | | | | | | | 70 | | 41 | 17 | | | | | | | | | | |
| | | | | | | | | | | 59 | | 72 | | 74 | | | | | | | | | |
| 3 | | | | | | | | 25 | | | | | | 31 | | | | | | | | | |
| | | | | | | | | 54 | | | | | | 65 | | | | | | | | 68 | |
| 15 | | | | | | | | | | | | 18 | 29 | | | | | | | | | | |
| 11 | | | | | | | | 21 | | | | | | | | | | | 33 | | | | |
| 30 | | | | | | | | | | | | | 29 | | | | | | 80 | | | | |

TABLE 3-continued

| | | | | | | | | | | | | | | | | | | | | | | | |
|---|---|---|---|---|---|---|---|---|---|---|---|---|---|---|---|---|---|---|---|---|---|---|---|
| 50 | | | | | | | | 41 | | | | | | | | 79 | | | | | | | |
| | | | | | | | | | | | | 51 | | 41 | | | | | | | | 45 | |
| | | | | | | | | 18 | | | | | | | | | 77 | | | | | | |
| 3 | | | | 51 | | | | 6 | | | | | | | | | | | | | | | |
| | | | | | | | | 34 | | 58 | | | | 67 | | | | | | | | | |
| | | | | | | | | | | 14 | | | | | | | 30 | 56 | | | | | |
| | | | | | | | | | | | | | | 69 | | | | 64 | | | | | |
| | | | | | | | | | 58 | | | 59 | | | 11 | | | | | | | | |
| 74 | | | | | | | | | | | | 48 | | 38 | | | | | | | | | |
| 41 | | | | | | | | | | 52 | | | | | 16 | | | | | | | | |
| | | | | | | | | | | | | 58 | | | | 63 | | | | 80 | | | |
| 8 | | | | | | | | | | | | 2 | | | | | | 25 | | | | | |
| 64 | | | | | | | | | | | | | | | | | | | | 35 | | | |
| 68 | | | | | | | | | | | 4 | 26 | | | | | | | | | | | |
| 39 | | | | | | | | | | | | 66 | | | | | | | | | | 61 | |
| | | | | | | | | | | | 26 | 50 | | | | | | 31 | | | | | |
| | | | | | | | | | | | | | | 11 | | 18 | | | | | | | |
| | | | | | | | | | 73 | 80 | | | | | | | | | 44 | | | | |
| | | | | | | | | | | | 54 | | 28 | | | | | | | | | | |
| 68 | | | | | | | | | | | | | | 0 | | | | | 55 | | | | |
| 53 | | | | | | | 3 | | | | | | | | 42 | | | | | | | | |
| 65 | | | | | | | | | | 72 | | | | | | 73 | | | | | | | |
| 54 | | | | | | | | | | | | 11 | | | | | | | | | | | 69 |
| 44 | | | | | | | | | | | | 15 | | | | | 70 | | | | | | |
| | | | | | | | | | | | | 57 | | | | 48 | | 61 | | | | | |
| | | | | | | | 48 | | | | | | | 30 | | | | 72 | | | | | |
| | | | | | | | 80 | | | 47 | | | | | | | | | | | | | |
| 4 | | | | | | | | | | | | 23 | | | | | | | 72 | | | | |
| | | | | | | | | | 59 | | | | 4 | | | | 69 | | | | | | |
| | | | | | | | | | 66 | | | | | | | | | 22 | | | | | |
| | | | | | | | | | | | | 52 | | | | 53 | | | 60 | | | | |
| | | | | | | | | 35 | | | | | | | | | | | | | 13 | | |
| | | | | | | | 65 | | 44 | | | | | | | 68 | | | | | | | |
| | | | | | | | | | | | | 16 | 9 | | | | 9 | | | | | | |
| | | | | | | | 10 | | | | | 3 | | 7 | | | | | | | | | |
| | | | | | | | | | | | | | | | | | 50 | | | | | 5 | |
| | | | | | | | | | 62 | | | | | | | 20 | 80 | | | | | | |

It should be noted that, Table 2 and Table 3 are merely example tables. In addition to the expression manners shown in Table 2 and Table 3, the preset 136-row matrix or the preset 100-row matrix may alternatively be expressed in another form, for example, an array. The preset 100-row matrix is used as an example. The 100-row matrix shown in Table 3 may also be presented in a manner shown in Table 4 below:

Table 4 includes 101 rows. The first row is a header, and the remaining 100 rows are the preset 100-row matrix. The header includes dc and values 1 to 11. dc represents a quantity of non-null elements, and a column corresponding to dc represents a quantity of non-null elements in each row. A column corresponding to the $i^{th}$ value in the values 1 to 11 represents a feature of the $i^{th}$ non-null element in each row. In Table 4, a feature of a non-null element is represented by (a first value, a second value). The first value indicates a value obtained by subtracting 1 from a column index of the non-null element in the check matrix H, and the second value indicates a value of the non-null element or a cyclic permutation value of a cyclic permutation matrix corresponding to the non-null element. For example, dc corresponding to the first row in the 100-row matrix is 11, and this indicates that the first row includes 11 non-null elements. (0, 60) in Table 4 indicates that a non-null element exists in the first row and the first column of the 100-row matrix, and a value of the non-null element is 60.

TABLE 4

| dc | 1 | 2 | 3 | 4 | 5 | 6 | 7 | 8 | 9 | 10 | 11 |
|---|---|---|---|---|---|---|---|---|---|---|---|
| 11 | 0.60 | 1.15 | 3.34 | 4.80 | 5.20 | 6.29 | 7.39 | 9.22 | 11.77 | 12.7 | 18.7 |
| 10 | 0.72 | 2.79 | 3.69 | 4.49 | 5.75 | 6.8 | 9.2 | 11.56 | 12.22 | 14.58 | |
| 8 | 1.18 | 2.47 | 4.21 | 5.80 | 6.38 | 7.50 | 9.75 | 11.32 | | | |
| 9 | 0.21 | 1.26 | 2.30 | 3.36 | 4.44 | 5.67 | 6.63 | 7.2 | 11.55 | | |
| 9 | 0.18 | 2.63 | 3.78 | 4.44 | 6.67 | 8.14 | 9.35 | 11.73 | 14.9 | | |
| 9 | 1.56 | 2.5 | 3.9 | 5.45 | 6.67 | 7.50 | 9.25 | 17.8 | 19.53 | | |
| 8 | 0.45 | 1.28 | 3.50 | 4.62 | 6.34 | 7.8 | 9.4 | 20.76 | | | |
| 7 | 2.80 | 3.50 | 4.13 | 5.40 | 6.32 | 9.0 | 10.20 | | | | |
| 8 | 1.47 | 2.38 | 3.55 | 4.45 | 6.67 | 7.71 | 9.57 | 23.38 | | | |
| 7 | 1.47 | 2.79 | 3.7 | 4.76 | 6.27 | 9.33 | 21.49 | | | | |
| 7 | 1.58 | 2.19 | 3.26 | 4.31 | 5.39 | 9.68 | 15.17 | | | | |
| 6 | 2.6 | 3.76 | 5.24 | 6.69 | 7.3 | 16.43 | | | | | |
| 6 | 1.40 | 3.34 | 6.37 | 7.42 | 9.1 | 13.10 | | | | | |
| 6 | 1.59 | 2.47 | 3.66 | 6.63 | 9.74 | 17.26 | | | | | |
| 6 | 2.47 | 3.3 | 4.53 | 5.67 | 7.67 | 22.46 | | | | | |
| 6 | 3.69 | 4.56 | 5.35 | 6.36 | 9.54 | 18.17 | | | | | |
| 6 | 3.7 | 6.26 | 7.77 | 9.24 | 16.43 | 22.32 | | | | | |
| 5 | 1.36 | 2.9 | 3.76 | 6.3 | 8.78 | | | | | | |

TABLE 4-continued

| dc | 1 | 2 | 3 | 4 | 5 | 6 | 7 | 8 | 9 | 10 | 11 |
|---|---|---|---|---|---|---|---|---|---|---|---|
| 5 | 1.14 | 2.45 | 6.0 | 7.59 | 19.39 | | | | | | |
| 5 | 1.4 | 3.4 | 6.54 | 8.31 | 13.31 | | | | | | |
| 5 | 1.48 | 2.39 | 3.33 | 6.32 | 10.34 | | | | | | |
| 5 | 1.46 | 4.47 | 6.6 | 13.69 | 20.22 | | | | | | |
| 5 | 1.66 | 3.64 | 6.10 | 9.77 | 23.42 | | | | | | |
| 5 | 1.23 | 2.62 | 6.65 | 15.43 | 16.43 | | | | | | |
| 5 | 1.6 | 2.48 | 3.16 | 6.29 | 12.23 | | | | | | |
| 5 | 2.3 | 3.11 | 6.44 | 8.34 | 16.70 | | | | | | |
| 4 | 1.59 | 2.49 | 3.16 | 14.1 | | | | | | | |
| 5 | 2.77 | 3.19 | 6.8 | 13.10 | 21.17 | | | | | | |
| 5 | 1.44 | 2.20 | 3.18 | 14.17 | 19.17 | | | | | | |
| 4 | 3.71 | 6.16 | 9.4 | 10.69 | | | | | | | |
| 4 | 2.27 | 3.18 | 12.36 | 14.0 | | | | | | | |
| 5 | 1.52 | 3.43 | 6.42 | 8.39 | 20.56 | | | | | | |
| 4 | 1.31 | 6.14 | 8.50 | 22.9 | | | | | | | |
| 4 | 3.22 | 6.38 | 9.64 | 18.80 | | | | | | | |
| 4 | 1.43 | 2.80 | 3.59 | 17.34 | | | | | | | |
| 5 | 2.48 | 3.31 | 6.22 | 15.77 | 16.71 | | | | | | |
| 4 | 3.21 | 6.54 | 10.41 | 13.65 | | | | | | | |
| 4 | 3.58 | 6.78 | 14.47 | 18.56 | | | | | | | |
| 5 | 1.70 | 3.21 | 6.13 | 11.8 | 13.41 | | | | | | |
| 4 | 1.22 | 6.19 | 18.63 | 21.74 | | | | | | | |
| 4 | 1.59 | 2.58 | 6.17 | 12.14 | | | | | | | |
| 5 | 1.59 | 3.72 | 6.32 | 15.29 | 20.29 | | | | | | |
| 4 | 1.71 | 2.79 | 14.21 | 20.24 | | | | | | | |
| 4 | 2.46 | 3.46 | 16.19 | 17.51 | | | | | | | |
| 4 | 1.53 | 2.75 | 13.34 | 22.28 | | | | | | | |
| 4 | 0.79 | 1.24 | 2.34 | 8.64 | | | | | | | |
| 3 | 1.73 | 2.25 | 10.49 | | | | | | | | |
| 4 | 1.48 | 2.18 | 17.64 | 19.72 | | | | | | | |
| 3 | 0.41 | 2.41 | 10.1 | | | | | | | | |
| 3 | 1.32 | 12.74 | 15.45 | | | | | | | | |
| 3 | 2.9 | 12.50 | 19.25 | | | | | | | | |
| 4 | 1.72 | 2.18 | 12.75 | 21.11 | | | | | | | |
| 3 | 0.40 | 1.34 | 2.43 | | | | | | | | |
| 4 | 1.57 | 2.71 | 8.76 | 11.29 | | | | | | | |
| 3 | 0.74 | 10.67 | 15.54 | | | | | | | | |
| 3 | 7.5 | 8.23 | 14.66 | | | | | | | | |
| 3 | 10.70 | 12.41 | 13.17 | | | | | | | | |
| 3 | 10.59 | 12.72 | 14.74 | | | | | | | | |
| 3 | 0.3 | 8.25 | 14.31 | | | | | | | | |
| 3 | 8.54 | 14.65 | 22.68 | | | | | | | | |
| 3 | 0.15 | 12.18 | 13.29 | | | | | | | | |
| 3 | 0.11 | 8.21 | 19.33 | | | | | | | | |
| 3 | 0.30 | 13.29 | 19.80 | | | | | | | | |
| 3 | 0.50 | 8.41 | 16.79 | | | | | | | | |
| 3 | 12.51 | 14.41 | 22.45 | | | | | | | | |
| 2 | 8.18 | 17.77 | | | | | | | | | |
| 3 | 0.3 | 4.51 | 8.6 | | | | | | | | |
| 3 | 8.34 | 10.58 | 14.67 | | | | | | | | |
| 3 | 10.14 | 17.30 | 18.56 | | | | | | | | |
| 2 | 14.69 | 18.64 | | | | | | | | | |
| 3 | 9.58 | 12.59 | 15.11 | | | | | | | | |
| 3 | 0.74 | 12.48 | 14.38 | | | | | | | | |
| 3 | 0.41 | 10.52 | 15.16 | | | | | | | | |
| 3 | 12.58 | 16.63 | 20.80 | | | | | | | | |
| 3 | 0.8 | 12.2 | 18.25 | | | | | | | | |
| 2 | 0.64 | 20.35 | | | | | | | | | |
| 3 | 0.68 | 11.4 | 12.26 | | | | | | | | |
| 3 | 0.39 | 12.66 | 22.61 | | | | | | | | |
| 3 | 11.26 | 12.50 | 18.31 | | | | | | | | |
| 2 | 14.11 | 16.18 | | | | | | | | | |
| 3 | 9.73 | 10.80 | 19.44 | | | | | | | | |
| 2 | 11.54 | 13.28 | | | | | | | | | |
| 3 | 0.68 | 14.0 | 19.55 | | | | | | | | |
| 3 | 0.53 | 7.3 | 15.42 | | | | | | | | |
| 3 | 0.65 | 10.72 | 16.73 | | | | | | | | |
| 3 | 0.54 | 12.11 | 23.69 | | | | | | | | |
| 3 | 0.44 | 12.15 | 17.70 | | | | | | | | |
| 3 | 12.57 | 16.48 | 18.61 | | | | | | | | |
| 3 | 7.48 | 14.30 | 18.72 | | | | | | | | |
| 2 | 7.80 | 10.47 | | | | | | | | | |
| 3 | 0.4 | 12.23 | 19.72 | | | | | | | | |
| 3 | 9.59 | 13.4 | 17.69 | | | | | | | | |
| 2 | 9.66 | 18.22 | | | | | | | | | |
| 3 | 12.52 | 16.53 | 19.60 | | | | | | | | |
| 2 | 8.35 | 21.13 | | | | | | | | | |
| 3 | 7.65 | 9.44 | 16.68 | | | | | | | | |

TABLE 4-continued

| dc | 1 | 2 | 3 | 4 | 5 | 6 | 7 | 8 | 9 | 10 | 11 |
|---|---|---|---|---|---|---|---|---|---|---|---|
| 3 | 12.16 | 13.9 | 17.9 | | | | | | | | |
| 3 | 7.10 | 12.3 | 14.7 | | | | | | | | |
| 2 | 17.50 | 22.5 | | | | | | | | | |
| 3 | 9.62 | 16.20 | 17.80 | | | | | | | | |

It should be noted that, Table 4 is merely an example table. In addition to the content shown in Table 4, Table 4 further includes a row index in the check matrix for each row matrix in the 100-row matrix and a transmission code rate and a gap that correspond to each row matrix. The gap may be a difference between performance in this embodiment of this application and a decoding performance limit.

For example, if the first transmission code rate is 5/7, the matrix $H_{MC}$ is shown in Table 1, and the matrix $H_{IR}$ is a matrix of the first 100 rows in the 136-row matrix shown in Table 2, the first check matrix may be shown in FIG. 4*a*. In FIG. 4*a*, an empty block represents an all-zero matrix whose size is 81×81, an upper left corner is a 4×24 matrix $H_{MC}$, an upper right corner is a 4×4 all-zero matrix, a lower left corner is the first four rows of $H_{IR}$, and a lower right corner is a 4×4 identity matrix. In this case, the first check matrix has a size of 8 rows and 28 columns. Each entry in the first check matrix may be expanded based on an 81×81 square submatrix to obtain a parity check matrix of 648 rows and 2268 columns corresponding to the first check matrix. If the first transmission code rate is a code rate other than 5/6, an upper left part of a check matrix H formed by the matrixes shown in Table 1 and Table 2 may be extracted in the foregoing manner, so that the extracted matrix supports the first transmission code rate.

For another example, if the first transmission code rate is 5/7, the matrix $H_{MC}$ is shown in Table 1, and the matrix $H_{IR}$ is the 100-row matrix shown in Table 3, the first check matrix may be shown in FIG. 4*b*. In FIG. 4*b*, an empty block represents an all-zero matrix whose size is 81×81, an upper left corner is a 4×24 matrix $H_{MC}$, an upper right corner is a 4×4 all-zero matrix, a lower left corner is the first four rows of $H_{IR}$, that is, the first four rows of the 100-row matrix shown in Table 3, and a lower right corner is a 4×4 identity matrix. In this case, the first check matrix has a size of 8 rows and 28 columns. Each entry in the first check matrix may be expanded based on an 81×81 square submatrix to obtain a parity check matrix of 648 rows and 2268 columns corresponding to the first check matrix. For another example, if the first transmission code rate is a code rate other than 5/6, an upper left part of a check matrix H formed by the matrixes shown in Table 1 and Table 3 may be extracted in the foregoing manner.

Step 303: The transmit end sends an encoded first codeword to a receive end.

A code length of the first codeword may be (n+j×Z), and the first codeword includes the k information bits and (n+j×Z−k) redundant bits. For example, that the transmit end sends a first codeword to a receive end may include: the transmit end modulates the first codeword, and sends the modulated first codeword to the receive end.

Based on the method shown in FIG. 3, the transmit end may extract, based on a transmission code rate required for sending the information bits, corresponding check bits from the check matrix H obtained by extending rows and columns of a check matrix in an existing standard, to perform LDPC encoding on the information bits, thereby meeting a transmission code rate requirement, and improving data transmission reliability.

Correspondingly, after the receive end receives the modulated first codeword, the receive end may demodulate the modulated first codeword to obtain the first codeword, extract corresponding elements from the check matrix H based on the first transmission code rate to obtain the first check matrix, and decode the first codeword based on the first check matrix.

The transmit end may indicate the first transmission code rate to the receive end.

As described above, the check matrix H may be pre-stored at the receive end. For a process in which the receive end extracts the corresponding elements from the check matrix H based on the first transmission code rate to obtain the first check matrix, refer to the description of step 302. For a process in which the receive end decodes the first codeword based on the first check matrix, refer to a conventional technology. Details are not described again.

Further, if the receive end determines that the decoding of the first codeword fails, that is, transmission of the first codeword fails, the transmit end performs the first retransmission by sending new incremental redundant bits or new incremental redundant bits and some of the information bits to the receive end, so as to reduce a transmission code rate and obtain a better decoding effect. Specifically, the method further includes the following steps.

The transmit end encodes the k information bits by using a second check matrix based on a second transmission code rate R satisfying R=k/(n+h×Z) to obtain an encoded second codeword, where h is an integer greater than j and less than or equal to Q; a code length of the second codeword is (n+h×Z), and the second codeword includes the k information bits and (n+h×Z−k) redundant bits; and the (n+h×Z−k) redundant bits include the (n+j×Z−k) redundant bits in the first codeword, and the (n+j×Z−k) redundant bits are the first several bits in the (n+h×Z−k) redundant bits.

The transmit end sends the incremental redundant bits to the receive end, or sends some of the k information bits and the incremental redundant bits to the receive end, where the incremental redundant bits are the $(n+j\times Z-k+1)^{th}$ to the $(n+h\times Z-k)^{th}$ redundant bits in the (n+h×Z−k) redundant bits.

The second transmission code rate may be a rate at which the transmit end performs the first retransmission to the receive end. The transmit end may select, based on a current communications environment between the transmit end and the receive end and another parameter, one transmission code rate from preset transmission code rates as the second transmission code rate. The second transmission code rate is less than the first transmission code rate.

For example, the transmit end may extract elements from the first ((n−k)/Z+h) rows and the first (n/Z+h) columns in the check matrix H based on the second transmission code rate to obtain the second check matrix. That the transmit end encodes the k information bits by using a second check matrix based on a second transmission code rate R satisfying R=k/(n+h×Z) to obtain an encoded second codeword may specifically be: the transmit end expands each element in the second check matrix based on a Z×Z square submatrix, and the transmit end performs LDPC encoding on the k information bits based on a parity check matrix of ((n−k)+h×Z) rows and (n+h×Z) columns that is obtained by expansion. For example, the transmit end may perform LDPC encoding on the k information bits by using the parity check matrix of (n−k)+j×Z) rows and (n+j×Z) columns by referring to a conventional technology. Details are not described.

Correspondingly, after the receive end receives the incremental redundant bits that are transmitted by the transmit end for the second time or some of the k information bits and the incremental redundant bits that are transmitted by the transmit end for the second time, the receive end may combine the incremental redundant bits to an end of the first codeword to form a new codeword, for example, the second codeword. In addition, the receive end extracts corresponding elements from the check matrix H to obtain the second check matrix, and decodes the new codeword based on the second check matrix.

Further, if the receive end determines that the decoding of the second codeword fails, that is, the first retransmission fails, the transmit end performs the second retransmission by sending new incremental redundant bits or new incremental redundant bits and some of the information bits to the receive end, so as to reduce a transmission code rate and obtain a better decoding effect. Specifically, with reference to the first retransmission, the method may further include the following.

The transmit end encodes the k information bits by using a third check matrix based on a third transmission code rate R satisfying R=k/(n+w×Z) to obtain an encoded third codeword, where the third check matrix is a submatrix of the first ((n−k)/Z+w) rows and the first (n/Z+w) columns in the check matrix H, and w is an integer greater than h and less than or equal to Q; a code length of the third codeword is (n+w×Z), and the third codeword includes the k information bits and (n+w×Z−k) redundant bits; and the (n+w×Z−k) redundant bits include the (n+h×Z−k) redundant bits in the second codeword, and the (n+h×Z−k) redundant bits are the first several bits in the (n+w×Z−k) redundant bits.

The transmit end sends the incremental redundant bits to the receive end, or sends some of the k information bits and the incremental redundant bits to the receive end, where the incremental redundant bits are the $(n+h\times Z-k+1)^{th}$ to the $(n+w\times Z-k)^{th}$ redundant bits in the (n+w×Z−k) redundant bits.

The third transmission code rate may be a rate at which the transmit end performs the second retransmission to the receive end. The transmit end may select, based on a current communications environment between the transmit end and the receive end and another parameter, one transmission code rate from the preset transmission code rates as the third transmission code rate. The third transmission code rate is less than the second transmission code rate.

The transmit end may extract elements from the first ((n−k)/Z+w) rows and the first (n/Z+w) columns in the check matrix H based on the third transmission code rate to obtain the third check matrix. That the transmit end encodes the k information bits by using a third check matrix based on a third transmission code rate R satisfying R=k/(n+w×Z) to obtain an encoded third codeword may specifically be: the transmit end expands each element in the third check matrix based on a Z×Z square submatrix, and the transmit end performs LDPC encoding on the k information bits based on a parity check matrix of ((n−k)+w×Z) rows and (n+w×Z) columns that is obtained by expansion. For example, the transmit end may perform LDPC encoding on the k information bits by using the parity check matrix of (n−k)+j×Z) rows and (n+j×Z) columns by referring to a conventional technology. Details are not described.

Correspondingly, after the receive end receives the incremental redundant bits that are transmitted by the transmit end for the third time or some of the k information bits and the incremental redundant bits that are transmitted by the transmit end for the third time, the receive end may combine the incremental redundant bits to an end of the second codeword to form a new codeword, for example, the third codeword. In addition, the receive end extracts corresponding elements from the check matrix H to obtain the third check matrix, and decodes the third codeword based on the third check matrix. If the decoding succeeds, the process ends; or if the decoding fails, the receive end performs retransmission again, and the process ends when the decoding succeeds or a quantity of retransmissions reaches an upper limit.

For each retransmission process, refer to the foregoing descriptions of the first retransmission or the second retransmission. Details are not described.

Figure 5:
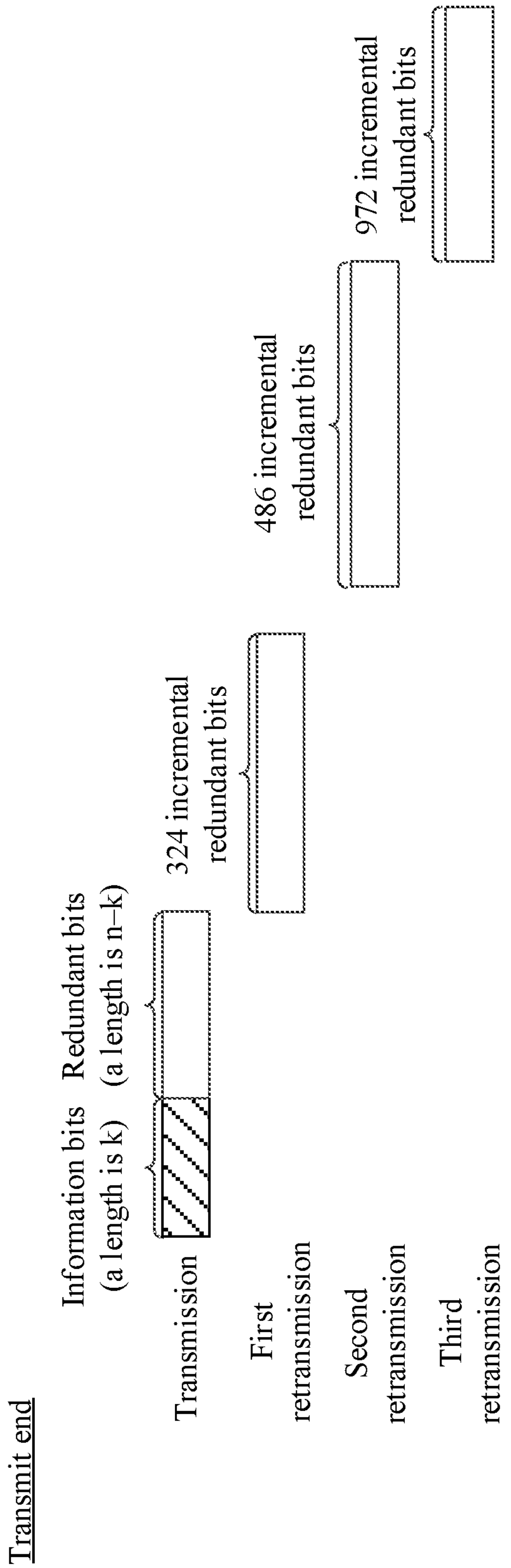
FIG. 5 is a schematic diagram in which a transmit end sends a message to a receive end by using an IR-HARQ technology.
Figure 6:
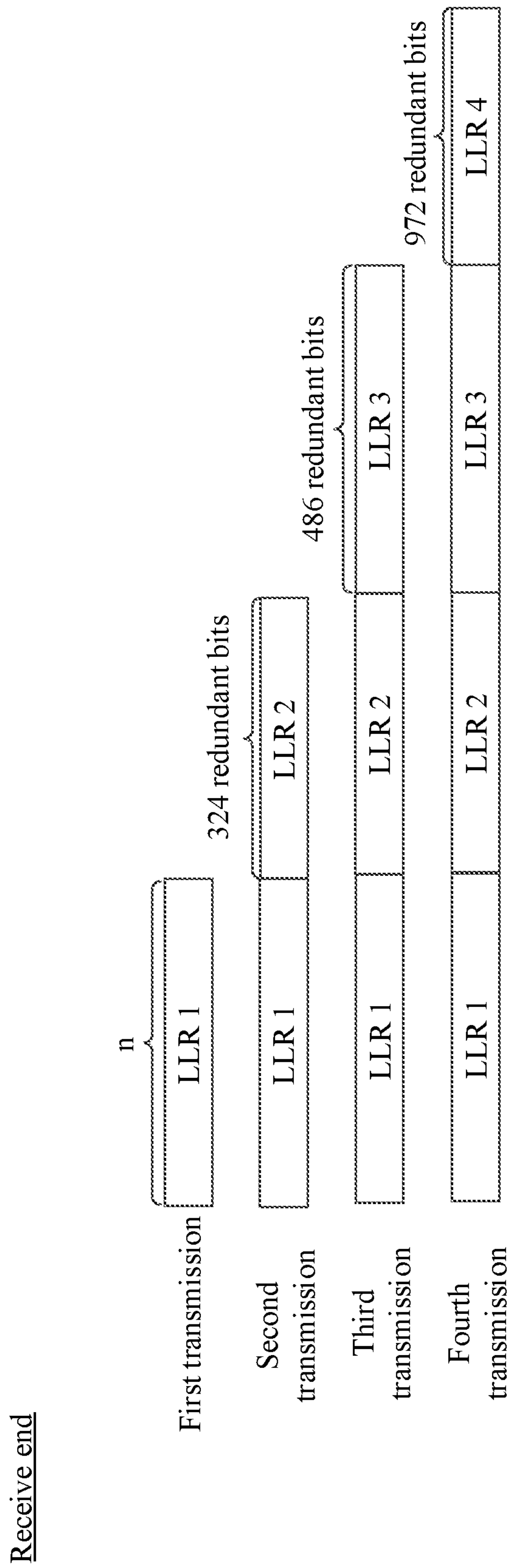
FIG. 6 is a schematic diagram in which a receive end decodes a message sent by a transmit end.

For example, n=1944, Z=81, k=1620, the matrix $H_{MC}$ is an existing check matrix with a code length n of 1944 and a code rate of 5/6, the rate-compatible check matrix H is a matrix of (4+100) rows and (24+100) columns, and the transmit end and the receive end successfully transmit the information bits only after performing four transmissions with each other. FIG. 5 and FIG. 6 are schematic diagrams of mutual communication between the transmit end and the receive end by using an IR-HARQ technology.

Refer to FIG. 5. During the first transmission, it is assumed that a transmission code rate R satisfies R=k/n=5/6. The transmit end extracts, based on the transmission code rate of 5/6, a submatrix of 4 rows and 24 columns at an upper left corner of the rate-compatible check matrix H, that is, extracts the matrix $H_{MC}$, performs LDPC encoding on information bits with a length of k by using the matrix $H_{MC}$ to obtain a first codeword including the k information bits and check bits with a length of n−k, and modulates the first codeword for transmission to the receive end. Correspondingly, as shown in FIG. 6, the receive end directly sends a demodulated log-likelihood ratio (LLR) 1 to a decoder for decoding. In this case, a length of the LLR 1 sent to the decoder is n. The decoder at the receive end decodes the LLR 1 with a length of n by using the matrix $H_{MC}$, and determines, by calculation based on a decoding result, whether a syndrome of the first codeword is 0. If yes, it indicates that the transmission succeeds; otherwise, the first retransmission, that is, the second transmission, needs to be performed.

Refer to FIG. 5. During the first retransmission, it is assumed that a transmission code rate R satisfies R=k/(n+4×Z)=5/7. The receive end extracts, based on the transmission code rate of 5/7, a submatrix of 8 rows and 28 columns at the upper left corner of the rate-compatible check matrix H, performs LDPC encoding on the information bits with the length of k by using the extracted submatrix to obtain a second codeword including the k information bits and check bits with a length of (n−k+4×Z), and modulates 324 (4×Z=324) incremental redundant bits obtained by comparing the check bits in the second codeword with the check bits in the first codeword, for transmission to the receive end. Correspondingly, as shown in FIG. 6, after receiving the modulated incremental redundant bits, the receive end directly appends a demodulated LLR 2 to the LLR 1 to form (LLR 1, LLR 2) with a length of 2268 (n+4×Z=2268). Then, the receive end sends (LLR 1, LLR 2) with the length of 2268 to the decoder for decoding. The decoder at the receive end decodes (LLR 1, LLR 2) with the length of 2268 by using the submatrix of 8 rows and 28 columns at the upper left corner of the check matrix H, and determines, by calculation based on a decoding result, whether a syndrome of the frame in the second transmission is 0. If yes, the transmission succeeds; otherwise, the second retransmission, that is, the third transmission, needs to be performed.

Refer to FIG. 5. During the second retransmission, it is assumed that a transmission code rate R satisfies $R=k/(n+6\times Z)=2/3$. The receive end extracts, based on the transmission code rate of 2/3, a submatrix of 10 rows and 30 columns at the upper left corner of the rate-compatible check matrix H, performs LDPC encoding on the information bits with the length of k by using the extracted submatrix to obtain a third codeword including the k information bits and check bits with a length of $(n-k+6\times Z)$, and modulates 486 ($6\times Z=486$) incremental redundant bits obtained by comparing the check bits in the third codeword with the check bits in the second codeword, for transmission to the receive end. Correspondingly, as shown in FIG. 6, after receiving the modulated incremental redundant bits, the receive end directly appends a demodulated LLR 3 to the LLR 2 to form (LLR 1, LLR 2, LLR 3) with a length of 2430 ($n+6\times Z=2430$). Then, the receive end sends (LLR 1, LLR 2, LLR 3) with the length of 2430 to the decoder for decoding. The decoder at the receive end decodes (LLR 1, LLR 2, LLR 3) with the length of 2430 by using the submatrix of 10 rows and 30 columns at the upper left corner of the check matrix H, and determines, by calculation based on a decoding result, whether a syndrome of the frame in the third transmission is 0. If yes, the transmission succeeds; otherwise, the third retransmission, that is, the fourth transmission, needs to be performed.

Refer to FIG. 5. During the third retransmission, it is assumed that a transmission code rate R satisfies $R=k/(n+12\times Z)=5/9$. The receive end extracts, based on the transmission code rate of 5/9, a submatrix of 16 rows and 36 columns at the upper left corner of the rate-compatible check matrix H, performs LDPC encoding on the information bits with the length of k by using the extracted submatrix to obtain a fourth codeword including the k information bits and check bits with a length of $(n-k+12\times Z)$, and modulates 972 ($12\times Z=972$) incremental redundant bits obtained by comparing the check bits in the fourth codeword with the check bits in the third codeword, for transmission to the receive end. Correspondingly, as shown in FIG. 6, after receiving the modulated incremental redundant bits, the receive end directly appends a demodulated LLR 4 to the LLR 3 to form (LLR 1, LLR 2, LLR 3, LLR 4) with a length of 2916 ($n+12\times Z=2916$). Then, the receive end sends (LLR 1, LLR 2, LLR 3, LLR 4) with the length of 2916 to the decoder for decoding. The decoder at the receive end decodes (LLR 1, LLR 2, LLR 3, LLR 4) with the length of 2916 by using the submatrix of 16 rows and 36 columns at the upper left corner of the check matrix H, and determines, by calculation based on a decoding result, whether a syndrome of the frame in the fourth transmission is 0. If yes, the transmission succeeds.

It should be noted that, FIG. 5 and FIG. 6 illustrate IR-HARQ by using only an example in which the transmit end transmits incremental redundant bits to the receive end during retransmission. It can be understood that, during retransmission, the transmit end may further transmit some information bits to the receive end in addition to the incremental redundant bits. This is not limited.

Figure 7:
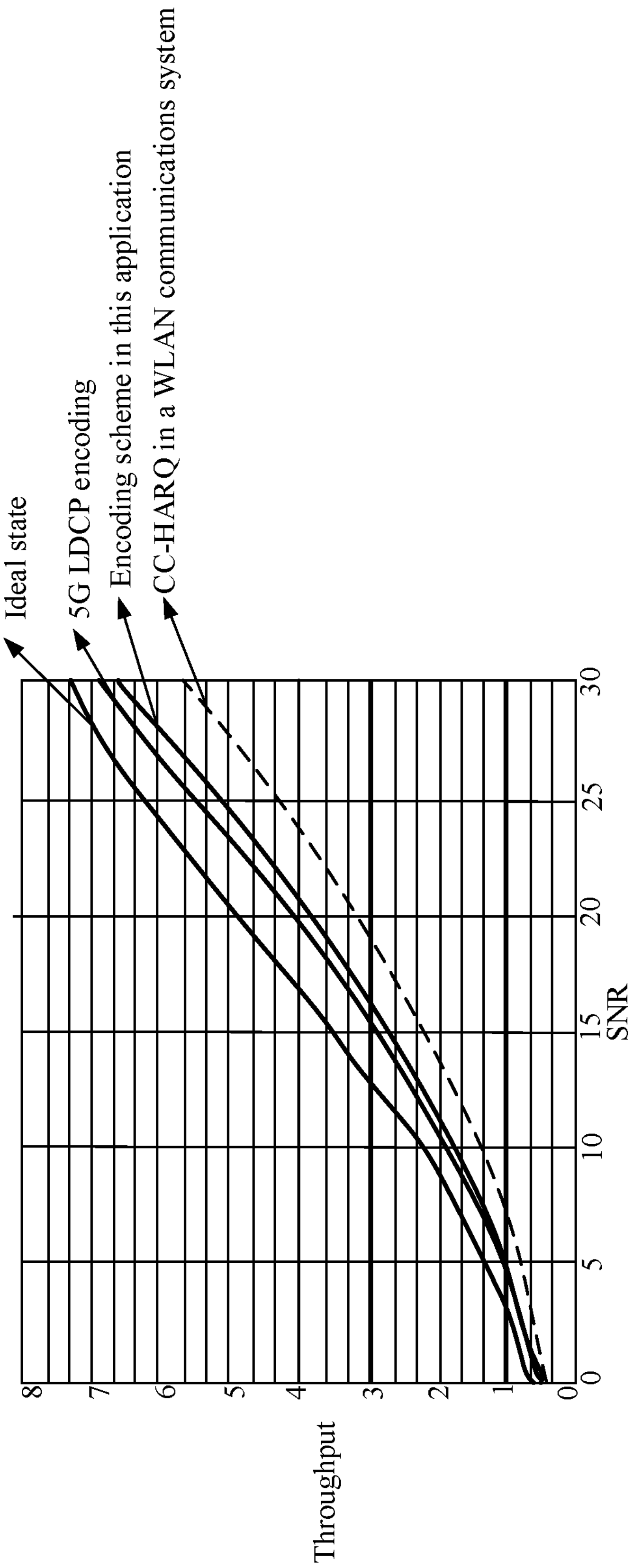
FIG. 7 is a diagram of simulation curves according to an embodiment of this application.

To describe performance of the LDPC encoding scheme provided in the embodiments of this application, FIG. 7 illustrates a diagram of a simulation curve of a system throughput of the encoding scheme provided in the embodiments of this application, a simulation curve of a system throughput of an encoding scheme used in an IR-HARQ process in an existing 5G communications system, and a simulation curve of a system throughput of CC-HARQ performed in a WLAN communications system in a communications scenario in which a channel transmission latency L is equal to 200 and a maximum quantity of channel transmissions is 4. As shown in FIG. 7, a horizontal axis is a signal-to-noise ratio (SNR) (dB), and a vertical axis is a system throughput. It can be learned from FIG. 7 that, the throughput corresponding to the encoding scheme provided in the embodiments of this application is higher than the throughput achieved by performing CC-HARQ in a WLAN communications system. In addition, the throughput corresponding to the encoding scheme provided in the embodiments of this application is close to the throughput of LDPC encoding in a 5G communications system, and the throughput of 5G LDPC is close to a throughput in an ideal case. It can be learned from FIG. 7 that, the throughput corresponding to the encoding scheme provided in the embodiments of this application is relatively high, thereby improving overall system performance.

Figure 8:
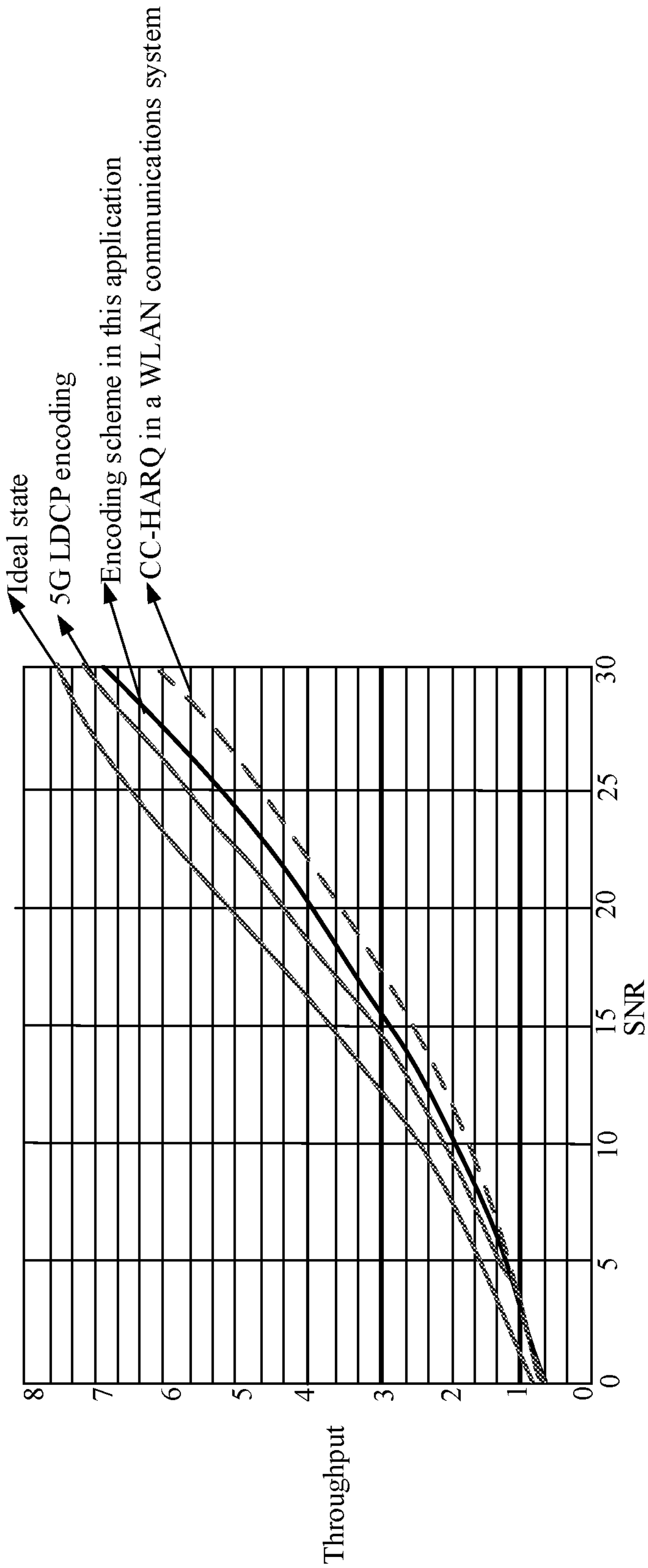
FIG. 8 is a diagram of other simulation curves according to an embodiment of this application.

For another example, FIG. 8 illustrates a diagram of a simulation curve of a system throughput of the encoding scheme provided in the embodiments of this application, a simulation curve of a system throughput of an encoding scheme used in an IR-HARQ process in an existing 5G communications system, and a simulation curve of a system throughput of CC-HARQ performed in a WLAN communications system in a communications scenario in which a channel transmission latency L is equal to 200 and a maximum quantity of channel transmissions is 4. As shown in FIG. 8, a horizontal axis is an SNR (dB), and a vertical axis is a system throughput. It can be learned from FIG. 8 that, the throughput corresponding to the encoding scheme provided in the embodiments of this application is higher than the throughput achieved by performing CC-HARQ in a WLAN communications system. In addition, the throughput corresponding to the encoding scheme provided in the embodiments of this application is close to the throughput of LDPC encoding in a 5G communications system, and the throughput of 5G LDPC is close to a throughput in an ideal case. It can be learned from FIG. 8 that, the throughput corresponding to the encoding scheme provided in the embodiments of this application is relatively high, thereby improving overall system performance.

The foregoing mainly describes the solutions provided in embodiments of this application from a perspective of interaction between nodes. It may be understood that, to implement the foregoing functions, the nodes include corresponding hardware structures and/or software modules for performing the functions. A person skilled in the art should easily be aware that, in combination with the examples described in embodiments disclosed in this specification, algorithm steps may be implemented by hardware or a combination of hardware and computer software in this application. Whether a specific function is performed by hardware or hardware driven by computer software depends on particular applications and design constraints of the technical solutions. A person skilled in the art may use different methods to implement the described functions for each particular application, but it should not be considered that the implementation goes beyond the scope of this application.

In embodiments of this application, division into function modules may be performed on the transmit end and the receive end based on the foregoing method examples. For example, each function module may be obtained through division based on each corresponding function, or two or more functions may be integrated into one processing module. The integrated module may be implemented in a form of hardware, or may be implemented in a form of a software function module. It should be noted that, in embodiments of this application, division into the modules is an example, and is merely logical function division. In actual implementation, another division manner may be used.

Figure 9:
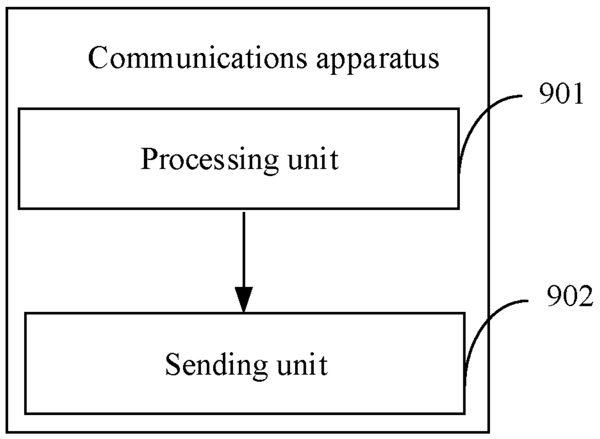
FIG. 9 is a schematic diagram of composition of a communications apparatus according to an embodiment of this application.

FIG. 9 is a diagram of a structure of a communications apparatus 90. The communications apparatus 90 may be a transmit end, or a chip or a system-on-a-chip in a transmit end. The communications apparatus 90 may be configured to perform functions of the transmit end in the foregoing embodiments. In an implementation, the communications apparatus 90 shown in FIG. 9 includes a processing unit 901 and a sending unit 902.

The processing unit 901 is configured to obtain k information bits, and perform LDPC encoding on the k information bits by using a first check matrix based on a first transmission code rate R satisfying R=k/(n+j×Z), where the first check matrix is a submatrix of the first ((n−k)/Z+j) rows and the first (n/Z+j) columns in a check matrix H. For example, the processing unit 901 can support the communications apparatus 90 in performing step 301 and step 302.

The sending unit 902 is configured to send an encoded first codeword including the k information bits and (n−k+j×Z) redundant bits to a receive end. For example, the sending unit 902 may support the communications apparatus 90 in performing step 303.

Further, the processing unit 901 is further configured to: when transmission of the first codeword fails, encode the k information bits by using a second check matrix based on a second transmission code rate R satisfying R=k/(n+h×Z) to obtain a second codeword, where the second check matrix is a submatrix of the first ((n−k)/Z+h) rows and the first (n/Z+h) columns in the check matrix H, a code rate of the second check matrix is equal to the second transmission code rate, and h is an integer greater than j and less than or equal to Q; and a code length of the second codeword is (n+h×Z), and the second codeword includes the k information bits and (n−k+h×Z) redundant bits.

The sending unit 902 is further configured to send incremental redundant bits to the receive end, or send some of the k information bits and incremental redundant bits to the receive end, where the incremental redundant bits are the $(n-k+j\times Z+1)^{th}$ to the $(n-k+h\times Z)^{th}$ redundant bits in the (n−k+h×Z) redundant bits.

n is an integer greater than 0, j is an integer greater than or equal to 0, the check matrix His a matrix of ((n−k)/Z+Q) rows and (n/Z+Q) columns, Q is an integer greater than or equal to j, each element in the check matrix H represents one Z×Z square submatrix, and the square submatrix is a cyclic permutation matrix of an identity matrix or an all-zero matrix; the check matrix H includes a matrix $H_{MC}$, a matrix $H_{IR}$ of Q rows and 24 columns, an all-zero matrix of 4 rows and Q columns, and an identity matrix of Q rows and Q columns; and the matrix $H_{MC}$ is a matrix of (n−k)/Z rows and n/Z columns, the matrix $H_{MC}$ is located at an upper left corner of the check matrix H, the matrix $H_{IR}$ of Q rows and 24 columns is located at a lower left corner of the check matrix H, the all-zero matrix of 4 rows and Q columns is located at an upper right corner of the check matrix H, and the identity matrix of Q rows and Q columns is located at a lower right corner of the check matrix H, that is, the check matrix H is a matrix obtained by extending rows and columns of the matrix $H_{MC}$.

In an example, the matrix $H_{IR}$ of Q rows and 24 columns may include any Q rows in the 136-row matrix shown in Table 2, for example, may be a matrix of the first Q rows in Table 2, a matrix of the last Q rows in Table 2, a matrix of Q consecutive rows starting from the $q^{th}$ row in Table 2, or a matrix of Q non-consecutive rows starting from the $q^{th}$ row in Table 2, where q is an integer greater than or equal to 1.

In another example, the matrix $H_{IR}$ of Q rows and 24 columns may include any Q rows in the 100-row matrix shown in Table 3, for example, may be a matrix of the first Q rows in Table 3, a matrix of the last Q rows in Table 3, a matrix of Q consecutive rows starting from the $q^{th}$ row in Table 3, or a matrix of Q non-consecutive rows starting from the $q^{th}$ row in Table 3, where q is an integer greater than or equal to 1.

Specifically, all related content of the steps in the method embodiment shown in FIG. 3 may be cited in function descriptions of corresponding function modules. Details are not described herein again. The communications apparatus 90 is configured to perform a function of a terminal in the LDPC encoding method shown in FIG. 3, and therefore, can achieve an effect same as that of the LDPC encoding method.

In another implementation, the communications apparatus 90 shown in FIG. 9 includes a processing module and a communications module. The processing module is configured to control and manage an action of the communications apparatus 90. For example, the processing module may integrate a function of the processing unit 901, and may be configured to support the communications apparatus 90 in performing step 301, step 302, and another process of the technology described in this specification. The communications module may integrate a function of the sending unit 902, and may be configured to support the communications apparatus 90 in performing step 303 and communicating with another network entity, for example, communicating with a function module or a network entity shown in FIG. 2. The communications apparatus 90 may further include a storage module, configured to store program code of the communications apparatus 90 and the check matrix H.

The processing module may be a processor or a controller. The processing module may implement or execute various example logical blocks, modules, and circuits described with reference to content disclosed in this application. Alternatively, the processor may be a combination of processors implementing a computing function, for example, a combination of one or more microprocessors, or a combination of a DSP and a microprocessor. The communications module may be a transceiver circuit, or the like. The storage module may be a memory. When the processing module is a processor, the communications module is a transceiver circuit, and the storage module is a memory, the communications apparatus 90 in this embodiment of this application may be the communications apparatus shown in FIG. 2.

An embodiment of this application further provides a computer-readable storage medium. All or some of the processes in the foregoing method embodiments may be completed by a computer program instructing related hardware. The program may be stored in the foregoing computer storage medium. When the program is executed, the processes of the foregoing method embodiments may be performed. The computer-readable storage medium may be an internal storage unit of the AP apparatus according to any one of the foregoing embodiments, for example, including a data transmit end and/or a data receive end. For example, the computer-readable storage medium may be a hard disk or a memory of the AP apparatus. The computer-readable storage medium may alternatively be an external storage device of the foregoing AP apparatus, for example, a plug-in hard disk, a smart media card (SMC), a secure digital (SD) card, or a flash card that is provided on the AP apparatus. Further, the computer-readable storage medium may alternatively include both an internal storage unit and an external storage device of the foregoing AP apparatus. The computer-readable storage medium is configured to store the computer program and other programs and data that are required by the foregoing AP apparatus. The computer-readable storage medium may be further configured to temporarily store data that has been output or is to be output.

It should be noted that, in the specification and the accompanying drawings of this application, the terms "first", "second", and the like are used to distinguish between different objects, rather than to describe a specific order. In addition, the terms "include", "have", and any other variant thereof are intended to cover non-exclusive inclusion. For example, a process, method, system, product, or device that includes a series of steps or units is not limited to the listed steps or units, but optionally further includes an unlisted step or unit, or optionally further includes another inherent step or unit of the process, method, product, or device.

It should be understood that, in this application, "at least one (item)" means one or more, "a plurality of" means two or more, "at least two (items)" means two, three, or more, and "and/or" is used to describe an association relationship between associated objects, and indicates that there may be three relationships. For example, "A and/or B" may indicate that only A exists, only B exists, and both A and B exist, where A and B may be singular or plural. The character "/" generally indicates an "or" relationship between the associated objects. "At least one of the following items (pieces)" or a similar expression thereof indicates any combination of these items, including a single item (piece) or any combination of a plurality of items (pieces). For example, at least one (piece) of a, b, or c may represent: a, b, c, "a and b", "a and c", "b and c", or "a, b, and c", where a, b, and c may be singular or plural.

It should be understood that in embodiments of this application, "B corresponding to A" indicates that B is associated with A. For example, B may be determined based on A. However, it should be further understood that B is determined based on A does not mean that B is determined based on only A, that is, B may alternatively be determined based on A and/or other information. In addition, in embodiments of this application, "connection" means various connection manners such as a direct connection or an indirect connection, for implementing communication between devices. This is not limited in embodiments of this application.

Unless otherwise specified, "transmit/transmission" in embodiments of this application refers to bidirectional transmission, and includes a sending action and/or a receiving action. Specifically, "transmit/transmission" in embodiments of this application includes data sending, data receiving, or data sending and data receiving. In other words, data transmission herein includes uplink and/or downlink data transmission. The data may include a channel and/or a signal. The uplink data transmission is uplink channel transmission and/or uplink signal transmission, and the downlink data transmission is downlink channel transmission and/or downlink signal transmission. In embodiments of this application, a "network" and a "system" convey a same concept, and a communications system is a communications network.

The foregoing descriptions about the implementations allow a person skilled in the art to clearly understand that, for the purpose of convenient and brief description, division into the foregoing function modules is merely used as an example for illustration. In actual application, the foregoing functions can be allocated to different function modules and implemented based on a requirement, that is, an inner structure of the apparatus is divided into different function modules to implement all or some of the functions described above.

In several embodiments provided in this application, it should be understood that the disclosed apparatus and method may be implemented in other manners. For example, the described apparatus embodiments are merely examples. For example, division into the modules or units is merely logical function division. There may be another division manner in actual implementation. For example, a plurality of units or components may be combined or may be integrated into another apparatus, or some features may be ignored or not be performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may be one or more physical units, may be located in one place, or may be distributed at different places. Some or all of the units may be selected based on actual requirements to achieve the objectives of the solutions of the embodiments.

In addition, function units in embodiments of this application may be integrated into one processing unit, or each of the units may exist alone physically, or two or more units may be integrated into one unit. The integrated unit may be implemented in a form of hardware, or may be implemented in a form of a software function unit.

When the integrated unit is implemented in a form of a software function unit and sold or used as an independent product, the integrated unit may be stored in a readable storage medium. Based on such an understanding, the technical solutions of the embodiments of this application essentially, or the part contributing to the conventional technology, or all or some of the technical solutions may be implemented in a form of a software product. The software product is stored in a storage medium and includes several instructions for instructing a device, where for example, the device may be a single-chip microcomputer or a chip, or a processor to perform all or some of the steps of the methods in the embodiments of this application. The foregoing storage medium includes: any medium that can store program code, such as a USB flash drive, a removable hard disk, a ROM, a RAM, a magnetic disk, or an optical disc.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A chip, comprising:

at least one processor; and one or more memories coupled to the at least one processor and storing programming instructions for execution by the at least one processor to cause a transmit end comprising the chip to:

obtain k information bits to be sent to a receive end;

perform low-density parity-check (LDPC) encoding on the k information bits by using a first check matrix based on a first transmission code rate R satisfying R=k/(n+j×Z) to obtain a first codeword; and send the first codeword to the receive end, wherein:

k is an integer greater than 0;

the first check matrix is a submatrix of the first ((n−k)/Z+j) rows and the first (n/Z+j) columns in a check matrix H, and a code rate of the first check matrix is equal to the first transmission code rate;

n is an integer greater than 0, j is an integer greater than or equal to 0, and Z is an integer greater than 0;

the check matrix H is a matrix of ((n−k)/Z+Q) rows and (n/Z+Q) columns, Q is an integer greater than or equal to j, each element in the check matrix H represents one Z×Z square submatrix, and the square submatrix is a cyclic permutation matrix of an identity matrix or an all-zero matrix;

the check matrix H comprises a matrix $H_{MC}$, a matrix $H_{IR}$ of Q rows and 24 columns, an all-zero matrix of 4 rows and Q columns, and an identity matrix of Q rows and Q columns; and the matrix $H_{MC}$ is a matrix of (n −k)/Z rows and n/Z columns, the matrix $H_{MC}$ is located at an upper left corner of the check matrix H, the matrix $H_{IR}$ of Q rows and 24 columns is located at a lower left corner of the check matrix H, the all-zero matrix of 4 rows and Q columns is located at an upper right corner of the check matrix H, and the identity matrix of Q rows and Q columns is located at a lower right corner of the check matrix H; and the first codeword comprises the k information bits and (n−k+j×Z) redundant bits.

2. The chip according to claim 1, wherein the programming instructions are for execution by the at least one processor to cause the transmit end to:

encode the k information bits by using a second check matrix based on a second transmission code rate R satisfying R=k/(n+h×Z) to obtain a second codeword when transmission of the first codeword fails, wherein the second check matrix is a submatrix of the first ((n−k)/Z+h) rows and the first (n/Z+h) columns in the check matrix H, a code rate of the second check matrix is equal to the second transmission code rate, h is an integer greater than j and less than or equal to Q, a code length of the second codeword is (n+h×Z), and the second codeword comprises the k information bits and (n−k+h×Z) redundant bits; and send incremental redundant bits to the receive end, or send some of the k information bits and incremental redundant bits to the receive end, wherein the incremental redundant bits are the $(n−k+j×Z+1)^{th}$ to the $(n−k+h×Z)^{th}$ redundant bits in the (n−k+h×Z) redundant bits.

3. The chip according to claim 1, wherein the matrix $H_{IR}$ of Q rows and 24 columns is any Q-row matrix in a preset 136-row matrix, each row in the preset 136-row matrix comprises 24 elements, each element represents one square submatrix whose size is Z×Z, a null element in each row represents an all-zero matrix, a specific value of a non-null element in each row is a cyclic permutation value of an identity matrix, and the preset 136-row matrix is as follows:

| | | | | | | | | | | | | | | | | | | | | | | | |
|---|---|---|---|---|---|---|---|---|---|---|---|---|---|---|---|---|---|---|---|---|---|---|---|
| | | | 25 | | | | | 24 | | | | | | | | | 6 | | | | | | 47 |
| | | | | 73 | | | 23 | | | | | | | | | 16 | | | | | 49 | | |
| 30 | | 16 | | | | | | | | | | | 47 | | | | | 19 | | | | | |
| | | | | | | 65 | | | 40 | | 44 | 0 | | | | | | | | | | | |
| | | | | | 60 | | | | | | | | | 71 | | | | | 56 | 53 | | | |
| | 55 | | | | | | | | | 24 | | | | | 55 | | | | | | | 39 | |
| | | | 79 | | | | 68 | | 14 | | | | 43 | | | | | | | | | | |
| | 71 | | | | | | | | | | | | | | 18 | 8 | | | | 25 | | | |
| | | 18 | | 16 | | | | | | | | | | 73 | | | | | | | | 35 | |
| | | | | | | | | | | 17 | 53 | | | | | | | 30 | | | | | 13 |
| | | | | | | 57 | | | | | | 47 | | | | | 52 | | | | 5 | | |
| 78 | | | | | 13 | | | 31 | | | | | | | | | | | 77 | | | | |
| | | 13 | | | | | | | | | | 10 | | 53 | | | 23 | | | | | | |
| 66 | | | | | | | | | 48 | | | | 71 | | | | | | | | | | 11 |
| | | | 4 | | | | | | | | 66 | | | | | | | | 10 | 9 | | | |
| | | | | | | | | | | | | | | | 10 | 37 | | | | | 18 | 52 | |
| | 68 | | | 2 | 43 | | | | | 75 | | | | | | | | | | | | | |
| | | | | | | 73 | 12 | 55 | | | | | | | | | | 29 | | | | | |
| | | 33 | | | | | | | | | | | 49 | | | | | 0 | | | | | 69 |
| 62 | | | | 55 | | | | | 33 | | 4 | | | | | | | | | | | | |
| | 51 | | | | | | 39 | | | | | | | | | 24 | | | | 33 | | | |
| | | | | | 7 | | | | | | | | | | 42 | | | | 80 | | | 31 | |
| | | | | | | 60 | | | | 52 | | 44 | | | | | 69 | | | | | | |
| | | | 41 | | | | | 19 | | | | | | 37 | | | | | | | 10 | | |
| | 61 | | | | | 28 | | | | | 9 | | | | | | | | | | 27 | | |
| | | | 49 | | | | 61 | | | | | | | | | 54 | 30 | | | | | | |
| | | 69 | | 56 | | | | | | | | | | | 18 | | | | 24 | | | | |
| 68 | | | | | 39 | | | | 34 | | | | 49 | | | | | | | | | | |
| | | | | | | | | | | | | 47 | | | | | | 40 | | 35 | | 43 | |
| | | | | | | | | 72 | | 27 | | | | 45 | | | | | | | | | 52 |
| | | | | 34 | | | 55 | 9 | 33 | | | | | | | | | | | | | | |
| | | | | | 58 | | | | | | | | | | | 68 | 77 | | | | 38 | | |
| | 52 | | 51 | | | 45 | | | | | | | | | | | | 40 | | | | | |

-continued

| | | | | | | | | | | | | | | | | | | | | | | | |
|---|---|---|---|---|---|---|---|---|---|---|---|---|---|---|---|---|---|---|---|---|---|---|---|
| 40 | | | | | | | | | | 20 | | 19 | | 71 | | | | | | | | | |
| | | | | | | | | | | | 4 | | 9 | | 62 | | | | 26 | | | | |
| | | 26 | | | | | | | | | | | | | | | | | | 61 | | 45 | 60 |
| | 21 | | | | | | 6 | | | | | | | | 63 | | | | 53 | | | | |
| 79 | | | | 4 | | | | | | | | 74 | | | | | | | | | 19 | | |
| | | | | | | | | | | 57 | 40 | | | | | | | 16 | | | | | 28 |
| | | 65 | 37 | | | 43 | | | | | | | | | | | | | | | | 40 | |
| | | | | | 52 | | | | 51 | | | | 78 | 79 | | | | | | | | | |
| | | | | | | | | 60 | | | | | | | | 11 | 40 | | | 52 | | | |
| | | | | 79 | | | | 46 | | | 70 | | | | 51 | | | | | | | | |
| | 70 | | | | 80 | | | | | | | | | 20 | | 42 | | | | | | | |
| | | | | | | | 58 | | | | | | 6 | | | | | | | | | 4 | 14 |
| | | | 31 | | | | | | | | | | | | | | 80 | 5 | 20 | | | | |
| | | | | | | 68 | | | | 37 | | | | | | | | | | 32 | 75 | | |
| 28 | | 74 | | | | | | | 42 | | | 16 | | | | | | | | | | | |
| 75 | 80 | | 63 | | | | | | | 35 | | | | | | | | | | | | | |
| | | | | | 52 | | | 14 | | | | | | | | | 62 | | | | | | 8 |
| | | | | | | | 29 | | | | | | | | | | | 45 | 26 | | | 57 | |
| | | 56 | | 24 | | | | | | | 40 | | | | | | | | | 33 | | | |
| | | | | | | | | | 51 | | | | 17 | | | 32 | | | | | 80 | | |
| | | | | | | 2 | | | | | | 49 | | 78 | 12 | | | | | | | | |
| | | | | | 24 | | | | | | | | | | | | | | 55 | | | 34 | 80 |
| | | | | | | 4 | | | | 36 | | 24 | | | 64 | | | | | | | | |
| 20 | | | | | | | | | | | 56 | | 38 | | | | | | | 77 | | | |
| | | | | | | | 50 | | 47 | | | | | 21 | | 34 | | | | | | | |
| | | | | 65 | | | | 69 | | | | | | | | | | 17 | | | 44 | | |
| | 59 | 63 | 10 | | | | | | | | | | | | | | 55 | | | | | | |
| | | | | | | | | | | | 58 | 68 | | 30 | | | | | 69 | | | | |
| | 7 | 11 | | | | | | | | | | | | | 59 | | | 25 | | | | | |
| | | | 76 | | | | | | | | | | 8 | | | | | | | | 39 | 11 | |
| 49 | | | | | | 67 | | | 39 | | | | | | | 26 | | | | | | | |
| | | | | | 57 | | 73 | | | 24 | | | | | | | | | | 45 | | | |
| | | | | 42 | | | | 1 | | | | | | | | | 60 | | | | | | 73 |
| | | | | 73 | | | | | | | | | | | 56 | | | 77 | 10 | | | | |
| | | 3 | | | | | | 39 | | | | | | | | | 61 | | | | | | 44 |
| 70 | | | | | 68 | | | | | 7 | | | | | | | | | | 43 | | | |
| | | | | | | 78 | | | | | | 20 | 55 | | | | | | | | | 76 | |
| | 3 | | 37 | | | | | | | | 59 | | | 7 | | | | | | | | | |
| | | | | | | | 38 | | 70 | | | | | | | 64 | | | | | 41 | | |
| | | | | | | 63 | | | | | | | | | 31 | 63 | | | | 2 | | | |
| | | | 5 | | 60 | | | | | | | | | | | | | 78 | 57 | | | | |
| | | | | | | | | 10 | | | | 67 | | 17 | | | | | | | | | 17 |
| | | 0 | | | | | | | | | 46 | | 59 | | | | | | | | | 51 | |
| 7 | 33 | | | 22 | | | | | 27 | | | | | | | | | | | | | | |
| | | | | | | | 4 | | | 19 | | | | | | | 9 | | | | 6 | | |
| | | | | | 0 | | | 43 | | | | | | | | | 38 | | | | 64 | | |
| | 5 | | | | | | | | | | 63 | 73 | | | | 55 | | | | | | | |
| | | | | 7 | | 44 | | | | | | | | | | | | 12 | | 21 | | | |
| | | 31 | | | | | | | | | | | 28 | 57 | | | | | | | | 2 | |
| 28 | | | 32 | | | | | | 65 | | | | | | 45 | | | | | | | | |
| | | | | | | | 2 | | | 41 | | | | | | | | | 53 | | | | 60 |
| | 62 | | | | | | | | | | | 67 | | | | | | | | | | 65 | 56 |
| 17 | | | | | | | | | | | | | | | 14 | | | | | 53 | 1 | | |
| | | | | | 20 | | | | | | | | 31 | | | | 34 | | 21 | | | | |
| | | | 0 | | | | | 65 | 63 | | | | | 32 | | | | | | | | | |
| | | | | | | 14 | 39 | | | | 11 | | | | | | | 58 | | | | | |
| | | 18 | | 75 | | | | | | 43 | | | | | | 74 | | | | | | | |
| | | | | | | | 25 | | | | | | 75 | | 0 | | | | | | | | 65 |
| | | | 6 | | | | | | | | | | | | | 80 | 67 | | | | 16 | | |
| | | | | | | 58 | | 76 | | | | | | | | | | 2 | | | | 76 | |
| | | 2 | | | | | | | | | 70 | | | 70 | | | | | 19 | | | | |
| 5 | | | | | 26 | | | | | | | 61 | | | | | | | | 46 | | | |
| | 16 | | | 70 | | | | | 20 | 73 | | | | | | | | | | | | | |
| | | 21 | | | 66 | | 29 | | | | | 50 | | | | | | | | | | | |
| | | | | 7 | | | | 50 | | | | | 78 | | | | | 7 | | | | | |
| 51 | | | | | | 16 | | | 75 | | | | | | | | | | | | | 69 | |
| | 61 | | | | | | | | | | | | | | | 77 | | | | | 35 | | 36 |
| | | | | | | | | | | 4 | 41 | | | | | | | | 73 | 14 | | | |
| | | | 17 | | | | | | | | | | | 20 | 4 | | 17 | | | | | | |
| | | | | | | | | | 76 | | | | | 23 | | | 68 | | | 8 | | | |
| 6 | | | | | | | | | | | 52 | | | | 70 | 55 | | | | | | | |
| | | | | | 37 | | | 50 | | 44 | | | | | | | | 6 | | | | | |
| | 54 | 16 | 55 | | | | 14 | | | | | | | | | | | | | | | | |
| | | | | 51 | | 63 | | | | | | | 70 | | | | | | | | | 65 | |
| | | | | | | | | | | | | 13 | | | | | | | 25 | | 64 | | 4 |
| | 74 | | | | | | 80 | | | 79 | | 45 | | | | | | | | | | | |
| | | | | | | | | | 48 | | | | | | | | 58 | | | | 34 | | 25 |
| | | | | 34 | | | | | | | | | | 52 | 30 | | | | 10 | | | | |
| | | | 16 | | | | | 36 | | | 30 | | | | | | | 65 | | | | | |

-continued

| | | | | | | | | | | | | | | | | | | | | | | | |
|---|---|---|---|---|---|---|---|---|---|---|---|---|---|---|---|---|---|---|---|---|---|---|---|
| 54 | | | | | 41 | | | | | | | | | | | 73 | | | | 53 | | | |
| | | 8 | | | | 51 | | | | | | | 56 | | | | | | | | | 30 | |
| | | 5 | | | | | | | | 43 | | | | | | | | | 69 | | 55 | | |
| | 42 | | | | | | | | 14 | | | 7 | | | | | 74 | | | | | | |
| | | | | | | | 47 | | | | | | | 63 | | 21 | | | | | | | 74 |
| 20 | | | | | 11 | 8 | | | | | | | | | | | | | | | | 38 | |
| | | | 60 | 75 | | | | 73 | | | | | | | | | | 40 | | | | | |
| | | | | | | | | | | | 29 | | 14 | | 44 | | | | | 73 | | | |
| | | | | 41 | | | | | | | 9 | | | | | | | | | 62 | 24 | | |
| | | | | | 25 | | 9 | | 39 | | | | | 6 | | | | | | | | | |
| | | | | | | 33 | | 17 | | 66 | | | | | | 68 | | | | | | | |
| | 72 | | | | | | | | | | | | | | 74 | | | | 58 | | | | 44 |
| | | | 68 | | | | | | | | | 1 | | | | | | 76 | | | | 71 | |
| 1 | | 70 | | | | | | | | | | | 44 | | | | 13 | | | | | | |
| | | 74 | | | | | | | | | | | 16 | | | | | | | 48 | | 50 | |
| | 51 | | 56 | | | | | | | | | | | | 53 | | | | | | 72 | | |
| | | | | | | | | 12 | | | 70 | | | 80 | | | | 1 | | | | | |
| 4 | | | | | | 36 | 30 | | | | | | | | | | | | 44 | | | | |
| | | | | 27 | 42 | | | | | 50 | | | | | | | | | | | | | 45 |
| | | | | | | | | | 79 | | | 64 | | | | 62 | 79 | | | | | | |
| | | | 59 | | | | | | | | | | | | 76 | | | 77 | | | 42 | | |
| | | | | | | | | | 71 | | | | | 17 | | | | | | | | 14 | 58 |
| 31 | | | | | 44 | | 21 | | | | | | | | | | 56 | | | | | | |
| | | | | 10 | | | | 74 | | | | | 54 | | | 8. | | | | | | | |

4. The chip according to claim 1, wherein the matrix $H_{IR}$ of Q rows and 24 columns is any Q-row matrix in a preset 100-row matrix, each row in the preset 100-row matrix comprises 24 elements, each element represents one square submatrix whose size is Z×Z, a null element in each row represents an all-zero matrix, a specific value of a non-null element in each row is a cyclic permutation value of an identity matrix, and the preset 100-row matrix is as follows:

| | | | | | | | | | | | | | | | | | | | | | | | |
|---|---|---|---|---|---|---|---|---|---|---|---|---|---|---|---|---|---|---|---|---|---|---|---|
| 60 | 15 | | 34 | 80 | 20 | 29 | 39 | | 22 | | 77 | 7 | | | | | | 7 | | | | | |
| 72 | | 79 | 69 | 49 | 75 | 8 | | | 2 | | 56 | 22 | | 58 | | | | | | | | | |
| | 18 | 47 | | 21 | 80 | 38 | 50 | | 75 | | 32 | | | | | | | | | | | | |
| 21 | 26 | 30 | 36 | 44 | 67 | 63 | 2 | | | | 55 | | | | | | | | | | | | |
| 18 | | 63 | 78 | 44 | | 67 | | 14 | 35 | | 73 | | | 9 | | | | | | | | | |
| | 56 | 5 | 9 | | 45 | 67 | 50 | | 25 | | | | | | | | 8 | | 53 | | | | |
| 45 | 28 | | 50 | 62 | | 34 | 8 | | 4 | | | | | | | | | | | 76 | | | |
| | | 80 | 50 | 13 | 40 | 32 | | | 0 | 20 | | | | | | | | | | | | | |
| | 47 | 38 | 55 | 45 | | 67 | 71 | | 57 | | | | | | | | | | | | | | 38 |
| | 47 | 79 | 7 | 76 | | 27 | | | 33 | | | | | | | | | | | | 49 | | |
| | 58 | 19 | 26 | 31 | 39 | | | | 68 | | | | | | 17 | | | | | | | | |
| | | 6 | 76 | | 24 | 69 | 3 | | | | | | | | | 43 | | | | | | | |
| | 40 | | 34 | | | 37 | 42 | | 1 | | | | 10 | | | | | | | | | | |
| | 59 | 47 | 66 | | | 63 | | | 74 | | | | | | | | 26 | | | | | | |
| | | 47 | 3 | 53 | 67 | | 67 | | | | | | | | | | | | | | | 46 | |
| | | | 69 | 56 | 35 | 36 | | | 54 | | | | | | | | | 17 | | | | | |
| | | | 7 | | | 26 | 77 | | 24 | | | | | | | 43 | | | | | | 32 | |
| | 36 | 9 | 76 | | | 33 | | 78 | | | | | | | | | | | | | | | |
| | 14 | 45 | | | | 0 | 59 | | | | | | | | | | | | 39 | | | | |
| | 4 | | 4 | | | 54 | | 31 | | | | | 31 | | | | | | | | | | |
| | 48 | 39 | 33 | | | 32 | | | | 34 | | | | | | | | | | | | | |
| | 46 | | | 47 | | 6 | | | | | | | 69 | | | | | | | 22 | | | |
| | 66 | | 64 | | | 10 | | | 77 | | | | | | | | | | | | | | 42 |
| | 23 | 62 | | | | 65 | | | | | | | | | 43 | 43 | | | | | | | |
| | 6 | 48 | 16 | | | 29 | | | | | | 23 | | | | | | | | | | | |
| | | 3 | 11 | | | 44 | | 34 | | | | | | | | 70 | | | | | | | |
| | 59 | 49 | 16 | | | | | | | | | | | 1 | | | | | | | | | |
| | | 77 | 19 | | | 8 | | | | | | | 10 | | | | | | | | 17 | | |
| | 44 | 20 | 18 | | | | | | | | | | | 17 | | | | | 17 | | | | |
| | | | 71 | | | 16 | | | 4 | 69 | | | | | | | | | | | | | |
| | | 27 | 18 | | | | | | | | | 36 | | 0 | | | | | | | | | |
| | 52 | | 43 | | | 42 | | 39 | | | | | | | | | | | | 56 | | | |
| | 31 | | | | | 14 | | 50 | | | | | | | | | | | | | | 9 | |
| | | | 22 | | | 38 | | | 64 | | | | | | | | | 80 | | | | | |
| | 43 | 80 | 59 | | | | | | | | | | | | | | 34 | | | | | | |
| | | 48 | 31 | | | 22 | | | | | | | | | 77 | 71 | | | | | | | |
| | | | 21 | | | 54 | | | | 41 | | | 65 | | | | | | | | | | |
| | | | 58 | | | 78 | | | | | | | | 47 | | | | 56 | | | | | |
| | 70 | | 21 | | | 13 | | | | | 8 | | 41 | | | | | | | | | | |
| | 22 | | | | | 19 | | | | | | | | | | | | 63 | | | 74 | | |
| | 59 | 58 | | | | 17 | | | | | | 14 | | | | | | | | | | | |
| | 59 | | 72 | | | 32 | | | | | | | | | 29 | | | | | 29 | | | |
| | 71 | 79 | | | | | | | | | | | | 21 | | | | | | 24 | | | |
| | | 46 | 46 | | | | | | | | | | | | | 19 | 51 | | | | | | |
| | 53 | 75 | | | | | | | | | | | 34 | | | | | | | | | 28 | |

-continued

| | | | | | | | | | | | | | | | | | | | | | | | |
|---|---|---|---|---|---|---|---|---|---|---|---|---|---|---|---|---|---|---|---|---|---|---|---|
| 79 | 24 | 34 | | | | | | 64 | | | | | | | | | | | | | | | |
| | 73 | 25 | | | | | | | | 49 | | | | | | | | | | | | | |
| | 48 | 18 | | | | | | | | | | | | | | | 64 | | 72 | | | | |
| 41 | | 41 | | | | | | | | 1 | | | | | | | | | | | | | |
| | 32 | | | | | | | | | | | 74 | | | 45 | | | | | | | | |
| | | 9 | | | | | | | | | | 50 | | | | | | | 25 | | | | |
| | 72 | 18 | | | | | | | | | | 75 | | | | | | | | | 11 | | |
| 40 | 34 | 43 | | | | | | | | | | | | | | | | | | | | | |
| | 57 | 71 | | | | | | 76 | | | 29 | | | | | | | | | | | | |
| 74 | | | | | | | | | | 67 | | | | | 54 | | | | | | | | |
| | | | | | | | 5 | 23 | | | | | | 66 | | | | | | | | | |
| | | | | | | | | | | 70 | | 41 | 17 | | | | | | | | | | |
| | | | | | | | | | | 59 | | 72 | | 74 | | | | | | | | | |
| 3 | | | | | | | | 25 | | | | | | 31 | | | | | | | | | |
| | | | | | | | | 54 | | | | | | 65 | | | | | | | | 68 | |
| 15 | | | | | | | | | | | | 18 | 29 | | | | | | | | | | |
| 11 | | | | | | | | 21 | | | | | | | | | | | 33 | | | | |
| 30 | | | | | | | | | | | | | 29 | | | | | | 80 | | | | |
| 50 | | | | | | | | 41 | | | | | | | | 79 | | | | | | | |
| | | | | | | | | | | | | 51 | | 41 | | | | | | | | 45 | |
| | | | | | | | | 18 | | | | | | | | | 77 | | | | | | |
| 3 | | | | 51 | | | | 6 | | | | | | | | | | | | | | | |
| | | | | | | | | 34 | | 58 | | | | 67 | | | | | | | | | |
| | | | | | | | | | | 14 | | | | | | | 30 | 56 | | | | | |
| | | | | | | | | | | | | | | 69 | | | | 64 | | | | | |
| | | | | | | | | | 58 | | | 59 | | | 11 | | | | | | | | |
| 74 | | | | | | | | | | | | 48 | | 38 | | | | | | | | | |
| 41 | | | | | | | | | | 52 | | | | | 16 | | | | | | | | |
| | | | | | | | | | | | | 58 | | | | 63 | | | | 80 | | | |
| 8 | | | | | | | | | | | | 2 | | | | | | 25 | | | | | |
| 64 | | | | | | | | | | | | | | | | | | | | 35 | | | |
| 68 | | | | | | | | | | | 4 | 26 | | | | | | | | | | | |
| 39 | | | | | | | | | | | | 66 | | | | | | | | | | 61 | |
| | | | | | | | | | | | 26 | 50 | | | | | | 31 | | | | | |
| | | | | | | | | | | | | | | 11 | | 18 | | | | | | | |
| | | | | | | | | | 73 | 80 | | | | | | | | | 44 | | | | |
| | | | | | | | | | | | 54 | | 28 | | | | | | | | | | |
| 68 | | | | | | | | | | | | | | 0 | | | | | 55 | | | | |
| 53 | | | | | | | 3 | | | | | | | | 42 | | | | | | | | |
| 65 | | | | | | | | | | 72 | | | | | | 73 | | | | | | | |
| 54 | | | | | | | | | | | | 11 | | | | | | | | | | | 69 |
| 44 | | | | | | | | | | | | 15 | | | | | 70 | | | | | | |
| | | | | | | | | | | | | 57 | | | | 48 | | 61 | | | | | |
| | | | | | | | 48 | | | | | | | 30 | | | | 72 | | | | | |
| | | | | | | | 80 | | | 47 | | | | | | | | | | | | | |
| 4 | | | | | | | | | | | | 23 | | | | | | | 72 | | | | |
| | | | | | | | | | 59 | | | | 4 | | | | 69 | | | | | | |
| | | | | | | | | | 66 | | | | | | | | | 22 | | | | | |
| | | | | | | | | | | | | 52 | | | | 53 | | | 60 | | | | |
| | | | | | | | | 35 | | | | | | | | | | | | | 13 | | |
| | | | | | | | 65 | | 44 | | | | | | | 68 | | | | | | | |
| | | | | | | | | | | | | 16 | 9 | | | | 9 | | | | | | |
| | | | | | | | 10 | | | | | 3 | | 7 | | | | | | | | | |
| | | | | | | | | | | | | | | | | | 50 | | | | | 5 | |
| | | | | | | | | | 62 | | | | | | | 20 | 80. | | | | | | |

5. The chip according to claim 1, wherein a value of k is 1620.

6. The chip according to claim 1, wherein the k information bits include valid information bits and shortened all-zero padding bits.

7. A chip, comprising:

at least one processor; and one or more memories coupled to the at least one processor and storing programming instructions for execution by the at least one processor to:

obtain an encoded first codeword; and decode the encoded first codeword based on a first check matrix, wherein:

a code length of the encoded first codeword is (n+j×Z), and the encoded first codeword comprises k information bits and (n−k+j×Z) redundant bits;

the first check matrix is a submatrix of the first ((n−k)/Z+j) rows and the first (n/Z+j) columns in a check matrix H, and a code rate of the first check matrix is equal to a first transmission code rate;

n is an integer greater than 0, j is an integer greater than or equal to 0, and Z is an integer greater than 0;

the check matrix His a matrix of ((n−k)/Z+Q) rows and (n/Z+Q) columns, Q is an integer greater than or equal to j, each element in the check matrix H represents one Z×Z square submatrix, and the square submatrix is a cyclic permutation matrix of an identity matrix or an all-zero matrix;

the check matrix H comprises a matrix HMC, a matrix HIR of Q rows and 24columns, an all-zero matrix of 4 rows and Q columns, and an identity matrix of Q rows and Q columns; and the matrix HMC is a matrix of (n−k)/Z rows and n/Z columns, the matrix HMC is located at an upper left corner of the check matrix H, the matrix HIR of Q rows and 24 columns is located at a lower left corner of the check matrix H, the all-zero matrix of 4 rows and Q columns is located at an upper right corner of the check matrix H, and the identity matrix of Q rows and Q columns is located at a lower right corner of the check matrix H.

8. The chip according to claim 7, wherein the programming instructions are for execution by the at least one processor to:

receive incremental redundant bits that are transmitted by a transmit end for a second time or some of the k information bits and the incremental redundant bits that are transmitted by the transmit end;

combine the incremental redundant bits to an end of the first codeword to form a second codeword; and decode the second codeword based on a second check matrix, wherein the second check matrix is a submatrix of the first ((n−k)/Z+h) rows and the first (n/Z+h) columns in the check matrix H, a code rate of the second check matrix is equal to a second transmission code rate, and h is an integer greater than j and less than or equal to Q.

9. The chip according to claim 7, wherein the matrix $H_{IR}$ of Q rows and 24 columns is any Q-row matrix in a preset 136-row matrix, each row in the preset 136-row matrix comprises 24 elements, each element represents one square submatrix whose size is Z×Z, a null element in each row represents an all-zero matrix, a specific value of a non-null element in each row is a cyclic permutation value of an identity matrix, and the preset 136-row matrix is as follows:

| | | | | | | | | | | | | | | | | | | | | | | | |
|---|---|---|---|---|---|---|---|---|---|---|---|---|---|---|---|---|---|---|---|---|---|---|---|
| | | | 25 | | | | | 24 | | | | | | | | | 6 | | | | | | 47 |
| | | | | 73 | | | 23 | | | | | | | | | 16 | | | | | 49 | | |
| 30 | | 16 | | | | | | | | | | | 47 | | | | | 19 | | | | | |
| | | | | | | 65 | | | 40 | | 44 | 0 | | | | | | | | | | | |
| | | | | | 60 | | | | | | | | | 71 | | | | | 56 | 53 | | | |
| | 55 | | | | | | | | | 24 | | | | | 55 | | | | | | | 39 | |
| | | | 79 | | | | 68 | | 14 | | | | 43 | | | | | | | | | | |
| | 71 | | | | | | | | | | | | | | 18 | 8 | | | | 25 | | | |
| | | 18 | | 16 | | | | | | | | | | 73 | | | | | | | | 35 | |
| | | | | | | | | | | 17 | 53 | | | | | | | 30 | | | | | 13 |
| | | | | | | 57 | | | | | | 47 | | | | | 52 | | | | 5 | | |
| 78 | | | | | 13 | | | 31 | | | | | | | | | | | 77 | | | | |
| | | 13 | | | | | | | | | | 10 | | 53 | | | 23 | | | | | | |
| 66 | | | | | | | | | 48 | | | | 71 | | | | | | | | | | 11 |
| | | | 4 | | | | | | | | 66 | | | | | | | | 10 | 9 | | | |
| | | | | | | | | | | | | | | | 10 | 37 | | | | | 18 | 52 | |
| | 68 | | | 2 | 43 | | | | | 75 | | | | | | | | | | | | | |
| | | | | | | 73 | 12 | 55 | | | | | | | | | | 29 | | | | | |
| | | 33 | | | | | | | | | | | 49 | | | | | 0 | | | | | 69 |
| 62 | | | | 55 | | | | | 33 | | 4 | | | | | | | | | | | | |
| | 51 | | | | | | 39 | | | | | | | | | 24 | | | | 33 | | | |
| | | | | | 7 | | | | | | | | | | 42 | | | | 80 | | | 31 | |
| | | | | | | 60 | | | | 52 | | 44 | | | | | 69 | | | | | | |
| | | | 41 | | | | | 19 | | | | | | 37 | | | | | | | 10 | | |
| | 61 | | | | | 28 | | | | | 9 | | | | | | | | | | 27 | | |
| | | | 49 | | | | 61 | | | | | | | | | 54 | 30 | | | | | | |
| | | 69 | | 56 | | | | | | | | | | | 18 | | | | 24 | | | | |
| 68 | | | | | 39 | | | | 34 | | | | 49 | | | | | | | | | | |
| | | | | | | | | | | | | 47 | | | | | | 40 | | 35 | | 43 | |
| | | | | | | | | 72 | | 27 | | | | 45 | | | | | | | | | 52 |
| | | | | 34 | | | 55 | 9 | 33 | | | | | | | | | | | | | | |
| | | | | | 58 | | | | | | | | | | | 68 | 77 | | | | 38 | | |
| | 52 | | 51 | | | 45 | | | | | | | | | | | | 40 | | | | | |
| 40 | | | | | | | | | | 20 | | 19 | | 71 | | | | | | | | | |
| | | | | | | | | | | | 4 | | 9 | | 62 | | | | 26 | | | | |
| | | 26 | | | | | | | | | | | | | | | | | | 61 | | 45 | 60 |
| | 21 | | | | | | 6 | | | | | | | | 63 | | | | 53 | | | | |
| 79 | | | | 4 | | | | | | | | 74 | | | | | | | | | 19 | | |
| | | | | | | | | | | 57 | 40 | | | | | | | 16 | | | | | 28 |
| | | 65 | 37 | | | 43 | | | | | | | | | | | | | | | | 40 | |
| | | | | | 52 | | | | 51 | | | | 78 | 79 | | | | | | | | | |
| | | | | | | | | 60 | | | | | | | | 11 | 40 | | | 52 | | | |
| | | | | 79 | | | | 46 | | | 70 | | | | 51 | | | | | | | | |
| | 70 | | | | 80 | | | | | | | | | 20 | | 42 | | | | | | | |
| | | | | | | | 58 | | | | | | 6 | | | | | | | | | 4 | 14 |
| | | | 31 | | | | | | | | | | | | | | 80 | 5 | 20 | | | | |
| | | | | | | 68 | | | | 37 | | | | | | | | | | 32 | 75 | | |
| 28 | | 74 | | | | | | | 42 | | | 16 | | | | | | | | | | | |
| 75 | 80 | | 63 | | | | | | | 35 | | | | | | | | | | | | | |
| | | | | | 52 | | | 14 | | | | | | | | | 62 | | | | | | 8 |
| | | | | | | | 29 | | | | | | | | | | | 45 | 26 | | 57 | | |
| | | 56 | | 24 | | | | | | | 40 | | | | | | | | | 33 | | | |
| | | | | | | | | | 51 | | | | 17 | | | 32 | | | | | 80 | | |
| | | | | | | 2 | | | | | | 49 | | 78 | 12 | | | | | | | | |
| | | | | | 24 | | | | | | | | | | | | | | 55 | | | 34 | 80 |
| | | | | | | 4 | | | | 36 | | 24 | | | 64 | | | | | | | | |

-continued

| | | | | | | | | | | | | | | | | | | | | | | | |
|---|---|---|---|---|---|---|---|---|---|---|---|---|---|---|---|---|---|---|---|---|---|---|---|
| 20 | | | | | | | | | | | 56 | | 38 | | | | | | | 77 | | | |
| | | | | | | | 50 | | 47 | | | | | 21 | | 34 | | | | | | | |
| | | | | 65 | | | | 69 | | | | | | | | | | 17 | | | 44 | | |
| | 59 | 63 | 10 | | | | | | | | | | | | | | 55 | | | | | | |
| | | | | | | | | | | | 58 | 68 | | 30 | | | | | 69 | | | | |
| | 7 | 11 | | | | | | | | | | | | | 59 | | | 25 | | | | | |
| | | | 76 | | | | | | | | | | 8 | | | | | | | | 39 | 11 | |
| 49 | | | | | | 67 | | | 39 | | | | | | | 26 | | | | | | | |
| | | | | | 57 | | 73 | | | 24 | | | | | | | | | | 45 | | | |
| | | | | 42 | | | | 1 | | | | | | | | | 60 | | | | | | 73 |
| | | | | 73 | | | | | | | | | | | 56 | | | 77 | 10 | | | | |
| | | 3 | | | | | | 39 | | | | | | | | | 61 | | | | | | 44 |
| 70 | | | | | 68 | | | | | 7 | | | | | | | | | | 43 | | | |
| | | | | | | 78 | | | | | | 20 | 55 | | | | | | | | | 76 | |
| | 3 | | 37 | | | | | | | | 59 | | | 7 | | | | | | | | | |
| | | | | | | | 38 | | 70 | | | | | | | 64 | | | | | 41 | | |
| | | | | | | 63 | | | | | | | | | 31 | 63 | | | | 2 | | | |
| | | | 5 | | 60 | | | | | | | | | | | | | 78 | 57 | | | | |
| | | | | | | | | 10 | | | | 67 | | 17 | | | | | | | | | 17 |
| | | 0 | | | | | | | | | 46 | | 59 | | | | | | | | | 51 | |
| 7 | 33 | | | 22 | | | | | 27 | | | | | | | | | | | | | | |
| | | | | | | | 4 | | | 19 | | | | | | | 9 | | | | 6 | | |
| | | | | | 0 | | | 43 | | | | | | | | | 38 | | | | 64 | | |
| | 5 | | | | | | | | | | 63 | 73 | | | | 55 | | | | | | | |
| | | | | 7 | | 44 | | | | | | | | | | | | 12 | | 21 | | | |
| | | 31 | | | | | | | | | | | 28 | 57 | | | | | | | | 2 | |
| 28 | | | 32 | | | | | | 65 | | | | | | 45 | | | | | | | | |
| | | | | | | | 2 | | | 41 | | | | | | | | | 53 | | | | 60 |
| | 62 | | | | | | | | | | | 67 | | | | | | | | | | 65 | 56 |
| 17 | | | | | | | | | | | | | | | 14 | | | | | 53 | 1 | | |
| | | | | | 20 | | | | | | | | 31 | | | | 34 | | 21 | | | | |
| | | | 0 | | | | | 65 | 63 | | | | | 32 | | | | | | | | | |
| | | | | | | 14 | 39 | | | | 11 | | | | | | | 58 | | | | | |
| | | 18 | | 75 | | | | | | 43 | | | | | | 74 | | | | | | | |
| | | | | | | | 25 | | | | | | 75 | | 0 | | | | | | | | 65 |
| | | | 6 | | | | | | | | | | | | | 80 | 67 | | | | 16 | | |
| | | | | | | 58 | | 76 | | | | | | | | | | 2 | | | | 76 | |
| | | 2 | | | | | | | | | 70 | | | 70 | | | | | 19 | | | | |
| 5 | | | | | 26 | | | | | | | 61 | | | | | | | | 46 | | | |
| | 16 | | | 70 | | | | | 20 | 73 | | | | | | | | | | | | | |
| | | 21 | | | 66 | | 29 | | | | | 50 | | | | | | | | | | | |
| | | | | 7 | | | | 50 | | | | | 78 | | | | | 7 | | | | | |
| 51 | | | | | | 16 | | | 75 | | | | | | | | | | | | | 69 | |
| | 61 | | | | | | | | | | | | | | | 77 | | | | | 35 | | 36 |
| | | | | | | | | | | 4 | 41 | | | | | | | | 73 | 14 | | | |
| | | | 17 | | | | | | | | | | | 20 | 4 | | 17 | | | | | | |
| | | | | | | | | | 76 | | | | | 23 | | | 68 | | | 8 | | | |
| 6 | | | | | | | | | | | 52 | | | | 70 | 55 | | | | | | | |
| | | | | | 37 | | | 50 | | 44 | | | | | | | | 6 | | | | | |
| | 54 | 16 | 55 | | | | 14 | | | | | | | | | | | | | | | | |
| | | | | 51 | | 63 | | | | | | | 70 | | | | | | | | | 65 | |
| | | | | | | | | | | | | 13 | | | | | | | 25 | | 64 | | 4 |
| | 74 | | | | | | 80 | | | 79 | | 45 | | | | | | | | | | | |
| | | | | | | | | | 48 | | | | | | | | 58 | | | | 34 | | 25 |
| | | | | 34 | | | | | | | | | | 52 | 30 | | | | 10 | | | | |
| | | | 16 | | | | | 36 | | | 30 | | | | | | | 65 | | | | | |
| 54 | | | | | 41 | | | | | | | | | | | 73 | | | | 53 | | | |
| | | 8 | | | | 51 | | | | | | | 56 | | | | | | | | | 30 | |
| | | 5 | | | | | | | | 43 | | | | | | | | | 69 | | 55 | | |
| | 42 | | | | | | | | 14 | | | 7 | | | | | 74 | | | | | | |
| | | | | | | | 47 | | | | | | | 63 | | 21 | | | | | | | 74 |
| 20 | | | | | 11 | 8 | | | | | | | | | | | | | | | | 38 | |
| | | | 60 | 75 | | | | 73 | | | | | | | | | | 40 | | | | | |
| | | | | | | | | | | | 29 | | 14 | | 44 | | | | | 73 | | | |
| | | | | 41 | | | | | | | 9 | | | | | | | | | 62 | 24 | | |
| | | | | | 25 | | 9 | 39 | | | | | | 6 | | | | | | | | | |
| | | | | | | 33 | | 17 | | 66 | | | | | | 68 | | | | | | | |
| | 72 | | | | | | | | | | | | | | 74 | | | | 58 | | | | 44 |
| | | | 68 | | | | | | | | | 1 | | | | | | 76 | | | | 71 | |
| 1 | | 70 | | | | | | | | | | | 44 | | | | 13 | | | | | | |
| | | 74 | | | | | | | | | | | 16 | | | | | | | 48 | | 50 | |
| | 51 | | 56 | | | | | | | | | | | | 53 | | | | | | 72 | | |
| | | | | | | | | 12 | | | 70 | | | 80 | | | | 1 | | | | | |

-continued

| | | | | | | | | | | | | | | | | | | | | | | | |
|---|---|---|---|---|---|---|---|---|---|---|---|---|---|---|---|---|---|---|---|---|---|---|---|
| 4 | | | | | | 36 | 30 | | | | | | | | | | | | 44 | | | | |
| | | | | 27 | 42 | | | | | 50 | | | | | | | | | | | | | 45 |
| | | | | | | | | | 79 | | | 64 | | | | 62 | 79 | | | | | | |
| | | | 59 | | | | | | | | | | | | 76 | | | 77 | | | 42 | | |
| | | | | | | | | | 71 | | | | | 17 | | | | | | | | 14 | 58 |
| 31 | | | | | 44 | | 21 | | | | | | | | | | 56 | | | | | | |
| | | | | 10 | | | | 74 | | | | | 54 | | | 8. | | | | | | | |

10. The chip according to claim 7, wherein the matrix HIR of Q rows and 24columns is any Q-row matrix in a preset 100-row matrix, each row in the preset 100-row matrix comprises 24 elements, each element represents one square submatrix whose size is Z×Z, a null element in each row represents an all-zero matrix, a specific value of a non-null element in each row is a cyclic permutation value of an identity matrix, and the preset 100-row matrix is as follows:

| | | | | | | | | | | | | | | | | | | | | | | | |
|---|---|---|---|---|---|---|---|---|---|---|---|---|---|---|---|---|---|---|---|---|---|---|---|
| 60 | 15 | | 34 | 80 | 20 | 29 | 39 | | 22 | | 77 | 7 | | | | | | 7 | | | | | |
| 72 | | 79 | 69 | 49 | 75 | 8 | | | 2 | | 56 | 22 | | 58 | | | | | | | | | |
| | 18 | 47 | | 21 | 80 | 38 | 50 | | | | 32 | | | | | | | | | | | | |
| 21 | 26 | 30 | 36 | 44 | 67 | 63 | 2 | | | | 55 | | | | | | | | | | | | |
| 18 | | 63 | 78 | 44 | | 67 | | 14 | 35 | | 73 | | | 9 | | | | | | | | | |
| | 56 | 5 | 9 | | 45 | 67 | 50 | | 25 | | | | | | | | 8 | | 53 | | | | |
| 45 | 28 | | 50 | 62 | | 34 | 8 | | 4 | | | | | | | | | | | 76 | | | |
| | | 80 | 50 | 13 | 40 | 32 | | | 0 | 20 | | | | | | | | | | | | | |
| | 47 | 38 | 55 | 45 | | 67 | 71 | | 57 | | | | | | | | | | | | | | 38 |
| | 47 | 79 | 7 | 76 | | 27 | | | 33 | | | | | | | | | | | | 49 | | |
| | 58 | 19 | 26 | 31 | 39 | | | | 68 | | | | | | 17 | | | | | | | | |
| | | 6 | 76 | | 24 | 69 | 3 | | | | | | | | | 43 | | | | | | | |
| | 40 | | 34 | | | 37 | 42 | | 1 | | | | 10 | | | | | | | | | | |
| | 59 | 47 | 66 | | | 63 | | | 74 | | | | | | | | 26 | | | | | | |
| | | 47 | 3 | 53 | 67 | | 67 | | | | | | | | | | | | | | | 46 | |
| | | | 69 | 56 | 35 | 36 | | | 54 | | | | | | | | | 17 | | | | | |
| | | | 7 | | | 26 | 77 | | 24 | | | | | | | 43 | | | | | | 32 | |
| | 36 | 9 | 76 | | | 3 | | 78 | | | | | | | | | | | | | | | |
| | 14 | 45 | | | | 0 | 59 | | | | | | | | | | | | 39 | | | | |
| | 4 | | 4 | | | 54 | | 31 | | | | | 31 | | | | | | | | | | |
| | 48 | 39 | 33 | | | 32 | | | | 34 | | | | | | | | | | | | | |
| | 46 | | | 47 | | 6 | | | | | | | 69 | | | | | | | 22 | | | |
| | 66 | | 64 | | | 10 | | | 77 | | | | | | | | | | | | | | 42 |
| | 23 | 62 | | | | 65 | | | | | | | | | 43 | 43 | | | | | | | |
| | 6 | 48 | 16 | | | 29 | | | | | | 23 | | | | | | | | | | | |
| | | 3 | 11 | | | 44 | | 34 | | | | | | | | 70 | | | | | | | |
| | 59 | 49 | 16 | | | | | | | | | | | 1 | | | | | | | | | |
| | | 77 | 19 | | | 8 | | | | | | | 10 | | | | | | | | 17 | | |
| | 44 | 20 | 18 | | | | | | | | | | | 17 | | | | | 17 | | | | |
| | | | 71 | | | 16 | | | 4 | 69 | | | | | | | | | | | | | |
| | | 27 | 18 | | | | | | | | | 36 | | 0 | | | | | | | | | |
| | 52 | | 43 | | | 42 | | 39 | | | | | | | | | | | | 56 | | | |
| | 31 | | | | | 14 | | 50 | | | | | | | | | | | | | | 9 | |
| | | | 22 | | | 38 | | | 64 | | | | | | | | | 80 | | | | | |
| | 43 | 80 | 59 | | | | | | | | | | | | | | 34 | | | | | | |
| | | 48 | 31 | | | 22 | | | | | | | | | 77 | 71 | | | | | | | |
| | | | 21 | | | 54 | | | | 41 | | | 65 | | | | | | | | | | |
| | | | 58 | | | 78 | | | | | | | | 47 | | | | 56 | | | | | |
| | 70 | | 21 | | | 13 | | | | | 8 | | 41 | | | | | | | | | | |
| | 22 | | | | | 19 | | | | | | | | | | | | 63 | | | 74 | | |
| | 59 | 58 | | | | 17 | | | | | | 14 | | | | | | | | | | | |
| | 59 | | 72 | | | 32 | | | | | | | | | 29 | | | | | 29 | | | |
| | 71 | 79 | | | | | | | | | | | | 21 | | | | | | 24 | | | |
| | | 46 | 46 | | | | | | | | | | | | | 19 | 51 | | | | | | |
| | 53 | 75 | | | | | | | | | | | 34 | | | | | | | | | 28 | |
| 79 | 24 | 34 | | | | | | 64 | | | | | | | | | | | | | | | |
| | 73 | 25 | | | | | | | | 49 | | | | | | | | | | | | | |
| | 48 | 18 | | | | | | | | | | | | | | | 64 | | 72 | | | | |
| 41 | | 41 | | | | | | | | 1 | | | | | | | | | | | | | |
| | 32 | | | | | | | | | | | 74 | | | 45 | | | | | | | | |
| | | 9 | | | | | | | | | | 50 | | | | | | | 25 | | | | |
| | 72 | 18 | | | | | | | | | | 75 | | | | | | | | | 11 | | |
| 40 | 34 | 43 | | | | | | | | | | | | | | | | | | | | | |
| | 57 | 71 | | | | | | 76 | | | 29 | | | | | | | | | | | | |
| 74 | | | | | | | | | | 67 | | | | | 54 | | | | | | | | |
| | | | | | | | 5 | 23 | | | | | | 66 | | | | | | | | | |
| | | | | | | | | | | 70 | | 41 | 17 | | | | | | | | | | |
| | | | | | | | | | | 59 | | 72 | | 74 | | | | | | | | | |
| 3 | | | | | | | | 25 | | | | | | 31 | | | | | | | | | |
| | | | | | | | | 54 | | | | | | 65 | | | | | | | | 68 | |
| 15 | | | | | | | | | | | | 18 | 29 | | | | | | | | | | |
| 11 | | | | | | | | 21 | | | | | | | | | | | 33 | | | | |
| 30 | | | | | | | | | | | | | 29 | | | | | | 80 | | | | |

-continued

| | | | | | | | | | | | | | | | | | | |
|---|---|---|---|---|---|---|---|---|---|---|---|---|---|---|---|---|---|---|
| 50 | | | 41 | | | | | | | | 79 | | | | | | | |
| | | | | | | | 51 | | 41 | | | | | | | | 45 | |
| | | | 18 | | | | | | | | | 77 | | | | | | |
| 3 | 51 | | 6 | | | | | | | | | | | | | | | |
| | | | 34 | | 58 | | | | 67 | | | | | | | | | |
| | | | | | 14 | | | | | | | 30 | 56 | | | | | |
| | | | | | | | | | 69 | | | | 64 | | | | | |
| | | | | 58 | | | 59 | | | 11 | | | | | | | | |
| 74 | | | | | | | 48 | | 38 | | | | | | | | | |
| 41 | | | | | 52 | | | | | 16 | | | | | | | | |
| | | | | | | | 58 | | | | 63 | | | | 80 | | | |
| 8 | | | | | | | 2 | | | | | | 25 | | | | | |
| 64 | | | | | | | | | | | | | | | 35 | | | |
| 68 | | | | | | 4 | 26 | | | | | | | | | | | |
| 39 | | | | | | | 66 | | | | | | | | | | 61 | |
| | | | | | | 26 | 50 | | | | | | 31 | | | | | |
| | | | | | | | | | 11 | | 18 | | | | | | | |
| | | | | 73 | 80 | | | | | | | | | 44 | | | | |
| | | | | | | 54 | | 28 | | | | | | | | | | |
| 68 | | | | | | | | | 0 | | | | | 55 | | | | |
| 53 | | 3 | | | | | | | | 42 | | | | | | | | |
| 65 | | | | | 72 | | | | | | 73 | | | | | | | |
| 54 | | | | | | | 11 | | | | | | | | | | | 69 |
| 44 | | | | | | | 15 | | | | | 70 | | | | | | |
| | | | | | | | 57 | | | | 48 | | 61 | | | | | |
| | | 48 | | | | | | | 30 | | | | 72 | | | | | |
| | | 80 | | | 47 | | | | | | | | | | | | | |
| 4 | | | | | | | 23 | | | | | | | 72 | | | | |
| | | | | 59 | | | | 4 | | | | 69 | | | | | | |
| | | | | 66 | | | | | | | | | 22 | | | | | |
| | | | | | | | 52 | | | | 53 | | | 60 | | | | |
| | | | 35 | | | | | | | | | | | | | 13 | | |
| | | 65 | | 44 | | | | | | | 68 | | | | | | | |
| | | | | | | | 16 | 9 | | | | 9 | | | | | | |
| | | 10 | | | | | 3 | | 7 | | | | | | | | | |
| | | | | | | | | | | | | 50 | | | | | 5 | |
| | | | | 62 | | | | | | | 20 | 80. | | | | | | |

11. The chip according to claim 7, wherein a value of k is 1620.

12. The chip according to claim 7, wherein the k information bits include valid information bits and shortened all-zero padding bits.

* * * * *